(12) United States Patent
Kanazawa

(10) Patent No.: US 10,256,252 B1
(45) Date of Patent: Apr. 9, 2019

(54) THREE-DIMENSIONAL MEMORY DEVICE CONTAINING STRUCTURALLY REINFORCED PEDESTAL CHANNEL PORTIONS AND METHODS OF MAKING THE SAME

(71) Applicant: SANDISK TECHNOLOGIES LLC, Plano, TX (US)

(72) Inventor: Junpei Kanazawa, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/840,090

(22) Filed: Dec. 13, 2017

(51) Int. Cl.
| | |
|---|---|
| *H01L 27/11582* | (2017.01) |
| *H01L 29/10* | (2006.01) |
| *H01L 27/11524* | (2017.01) |
| *H01L 27/11526* | (2017.01) |
| *H01L 21/311* | (2006.01) |
| *H01L 21/02* | (2006.01) |

(Continued)

(52) U.S. Cl.
CPC .... *H01L 27/11582* (2013.01); *H01L 21/0217* (2013.01); *H01L 21/02164* (2013.01); *H01L 21/02211* (2013.01); *H01L 21/02233* (2013.01); *H01L 21/02274* (2013.01); *H01L 21/02636* (2013.01); *H01L 21/28273* (2013.01); *H01L 21/28282* (2013.01); *H01L 21/31111* (2013.01); *H01L 27/1157* (2013.01); *H01L 27/11524* (2013.01); *H01L 27/11526* (2013.01); *H01L 27/11556* (2013.01); *H01L 27/11573* (2013.01); *H01L 29/1037* (2013.01); *H01L 27/11519* (2013.01); *H01L 27/11565* (2013.01)

(58) Field of Classification Search
None
See application file for complete search history.

(56) References Cited

U.S. PATENT DOCUMENTS

| 5,915,167 A | 6/1999 | Leedy |
| 8,680,604 B2 | 3/2014 | Higashi et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Eva Y Montalvo
*Assistant Examiner* — Kevin Quinto
(74) *Attorney, Agent, or Firm* — The Marbury Law Group PLLC

(57) ABSTRACT

A three-dimensional memory device includes an alternating stack of insulating layers and electrically conductive layers located over a substrate, a memory opening extending through the alternating stack, a semiconductor pedestal channel portion located at a bottom portion of the memory opening, and a memory stack structure located in the memory opening and contacting a top surface of the pedestal channel portion. The memory stack structure includes a memory film and a vertical semiconductor channel located inside the memory film. A bottommost insulating layer among the insulating layers comprises a first silicon oxide material, and at least some of the insulating layers other than the bottommost insulating layer include a second silicon oxide material having a greater density than the first silicon oxide material.

19 Claims, 26 Drawing Sheets

(51) Int. Cl.
    *H01L 21/28*     (2006.01)
    *H01L 27/1157*     (2017.01)
    *H01L 27/11573*     (2017.01)
    *H01L 27/11556*     (2017.01)
    *H01L 27/11565*     (2017.01)
    *H01L 27/11519*     (2017.01)

(56) References Cited

U.S. PATENT DOCUMENTS

| | | | |
|---|---|---|---|
| 9,023,719 | B2 | 5/2015 | Pachamuthu et al. |
| 9,035,372 | B2 | 5/2015 | Song |
| 9,230,973 | B2 | 1/2016 | Pachamuthu et al. |
| 9,230,979 | B1 | 1/2016 | Pachamuthu et al. |
| 9,230,980 | B2 | 1/2016 | Rabkin et al. |
| 9,230,987 | B2 | 1/2016 | Pachamuthu et al. |
| 9,246,088 | B2 | 1/2016 | Yamamoto et al. |
| 9,356,043 | B1 | 5/2016 | Sakakibara et al. |
| 9,455,263 | B2 | 9/2016 | Zhang et al. |
| 9,478,558 | B2 | 10/2016 | Koka et al. |
| 9,484,357 | B2 | 11/2016 | Makala et al. |
| 9,524,976 | B2 | 12/2016 | Pachamuthu et al. |
| 9,576,967 | B1 | 2/2017 | Kimura et al. |
| 9,659,956 | B1 | 5/2017 | Pachamuthu et al. |
| 9,716,105 | B1 | 7/2017 | Tsutsumi |
| 9,768,192 | B1 | 9/2017 | Nakamura |
| 9,780,034 | B1 | 10/2017 | Tsutsumi et al. |
| 9,786,681 | B1 | 10/2017 | Ariyoshi |
| 2006/0102586 | A1 | 5/2006 | Lee et al. |
| 2007/0252201 | A1 | 11/2007 | Kito et al. |
| 2012/0199897 | A1 | 8/2012 | Chang et al. |
| 2013/0161821 | A1 | 6/2013 | Hwang et al. |
| 2014/0054676 | A1 | 2/2014 | Nam et al. |
| 2014/0198553 | A1 | 7/2014 | Lung |
| 2014/0284691 | A1 | 9/2014 | Takamura et al. |
| 2015/0104916 | A1 | 4/2015 | Lee et al. |
| 2015/0115348 | A1 | 4/2015 | Nam et al. |
| 2015/0179660 | A1 | 6/2015 | Yada et al. |
| 2015/0294978 | A1 | 10/2015 | Lu et al. |
| 2015/0348984 | A1 | 12/2015 | Yada et al. |
| 2016/0056169 | A1 | 2/2016 | Lee et al. |
| 2016/0099289 | A1 | 4/2016 | Yamato et al. |
| 2016/0111432 | A1 | 4/2016 | Rabkin et al. |
| 2016/0141294 | A1 | 5/2016 | Peri et al. |
| 2016/0172366 | A1* | 6/2016 | Koka ............... H01L 29/7883 257/314 |
| 2016/0268209 | A1 | 9/2016 | Pachamuthu et al. |
| 2016/0329101 | A1 | 11/2016 | Sakakibara |
| 2016/0329343 | A1 | 11/2016 | Pachamuthu et al. |
| 2016/0379989 | A1 | 12/2016 | Sharangpani et al. |
| 2017/0125437 | A1 | 5/2017 | Pachamuthu et al. |
| 2017/0125438 | A1 | 5/2017 | Pachamuthu et al. |
| 2017/0271261 | A1 | 9/2017 | Tsutsumi et al. |
| 2017/0271352 | A1 | 9/2017 | Nakamura |
| 2017/0287926 | A1 | 10/2017 | Ariyoshi |

OTHER PUBLICATIONS

Wong et al., "Wafer Temperature Dependence of the Vapor-Phase HF Oxide Etch," J. Electrochem., Soc., vol. 140, No. 1, pp. 205-208 (1993).

H. Seidel, J. Electrochem. Soc., vol. 137, No. 11 (1990), "Anisotropic Etching of Crystalline Silicon in Alkaline Solutions".

Matsumura, et al., "Formation of Silicon Nitride Film by HCD Ion Plating Process and its Properties", J. Japan Inst. Metals, Vo. 47, No. 11 (1983) pp. 991-997.

U.S. Appl. No. 15/296,380, filed Oct. 18, 2016, Sandisk Technologies LLC.

U.S. Appl. No. 15/347,101, filed Nov. 9, 2016, Sandisk Technologies LLC.

U.S. Appl. No. 15/401,426, filed Jan. 9, 2017, Sandisk Technologies LLC.

U.S. Appl. No. 15/626,766, filed Jun. 19, 2017, Sandisk Tehcnologies LLC.

U.S. Appl. No. 15/715,629, filed Sep. 26, 2017, Sandisk Technologies LLC.

\* cited by examiner

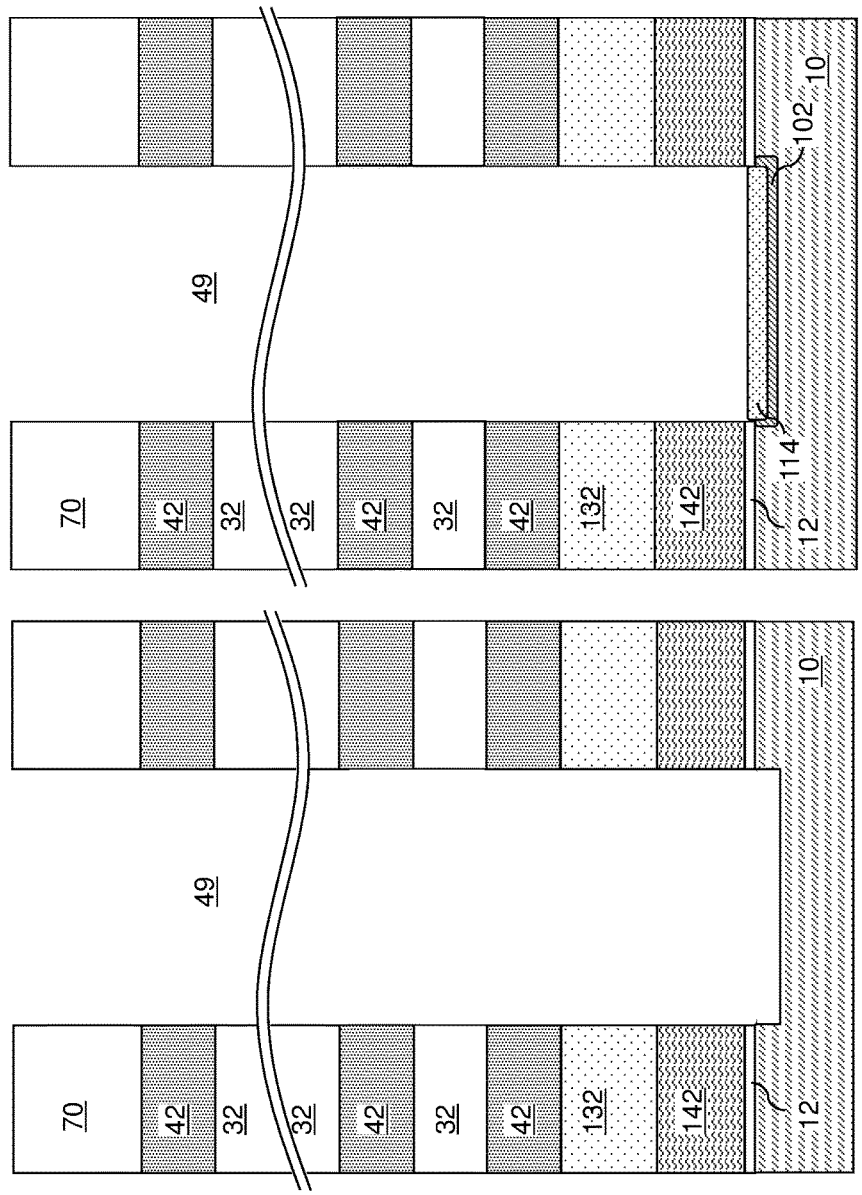

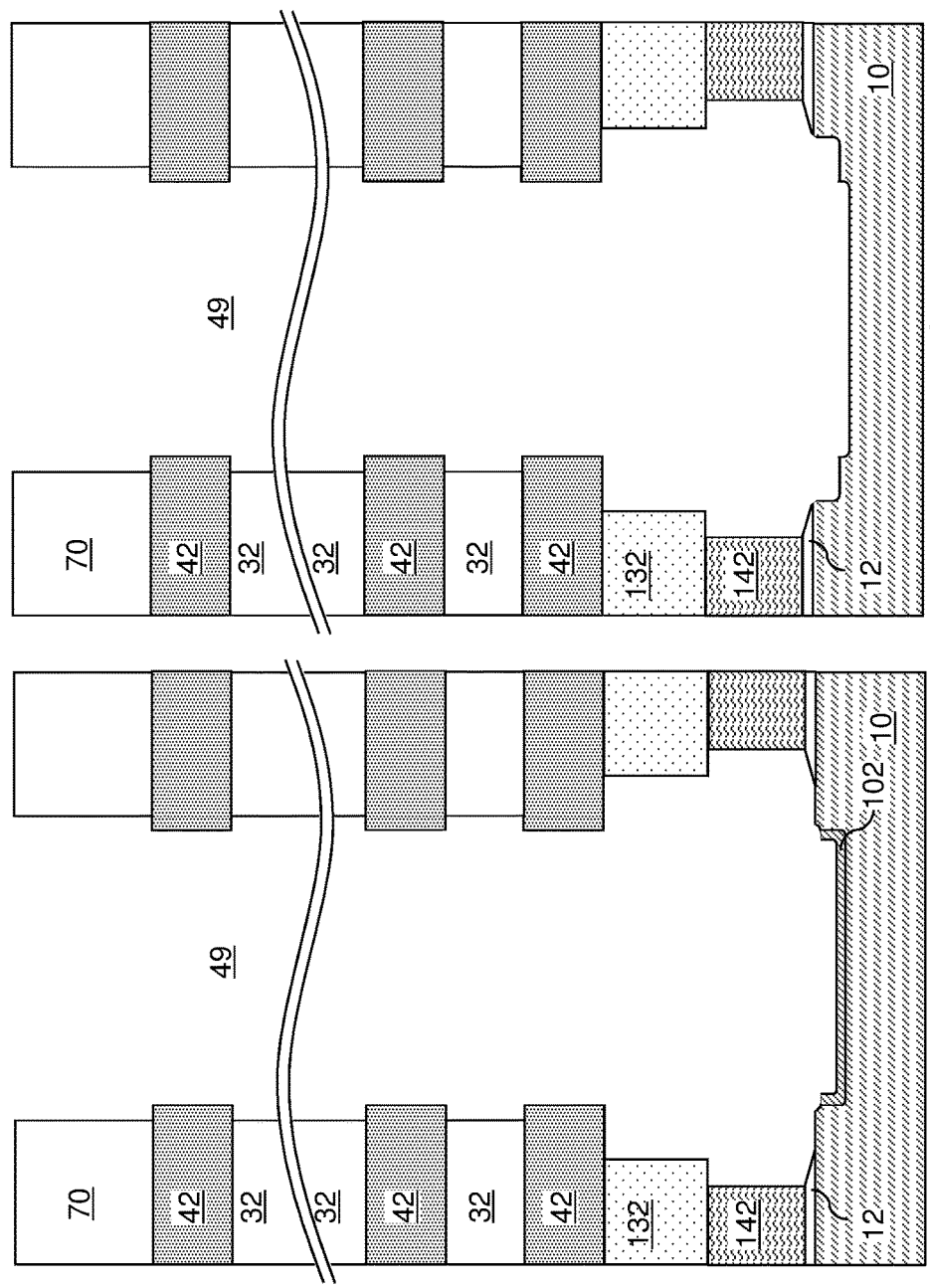

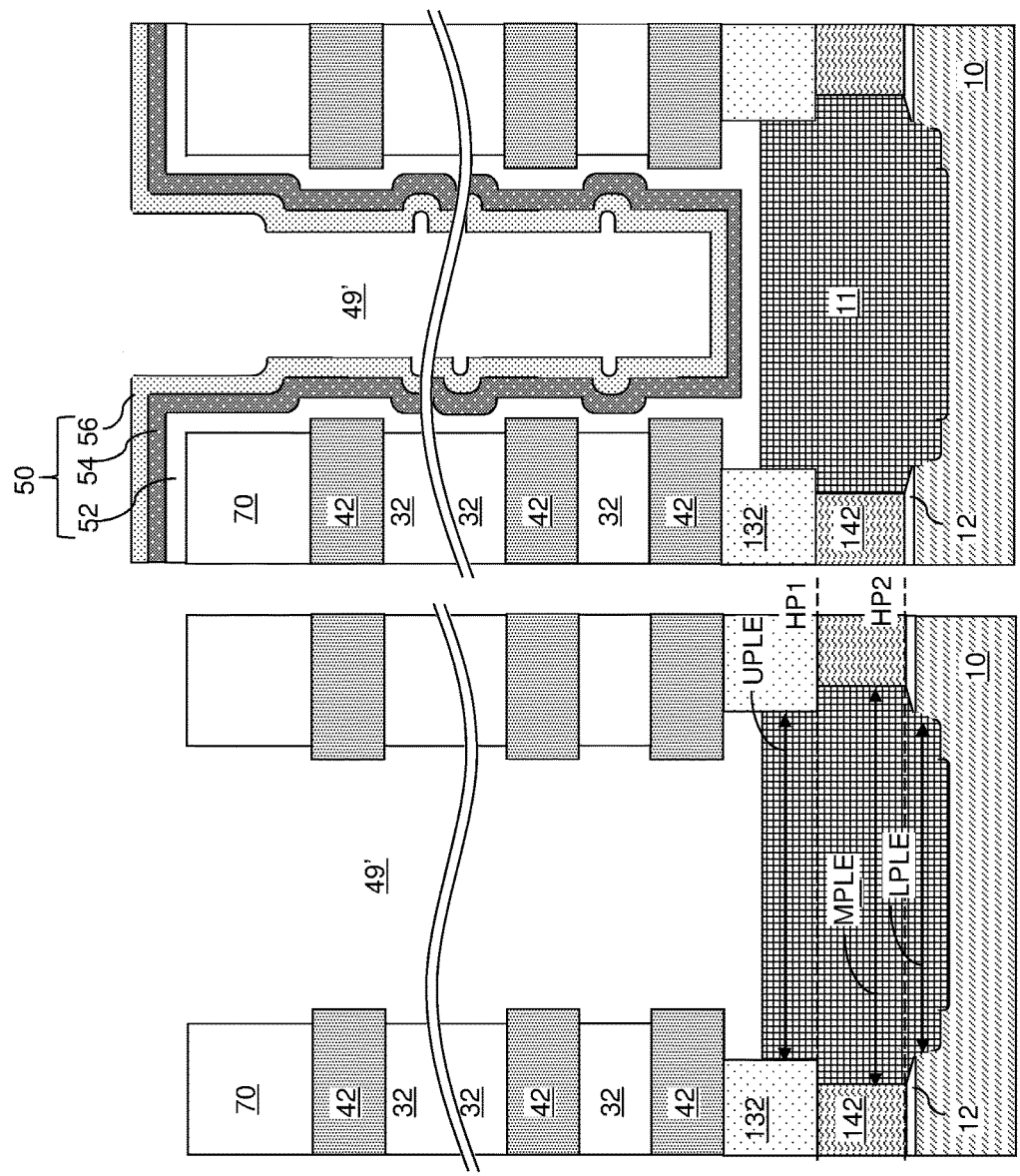

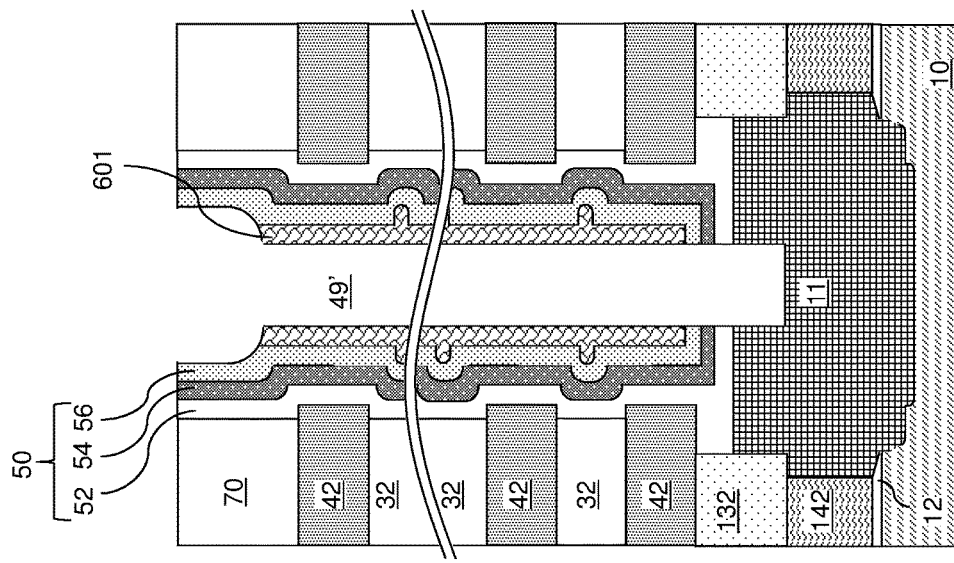
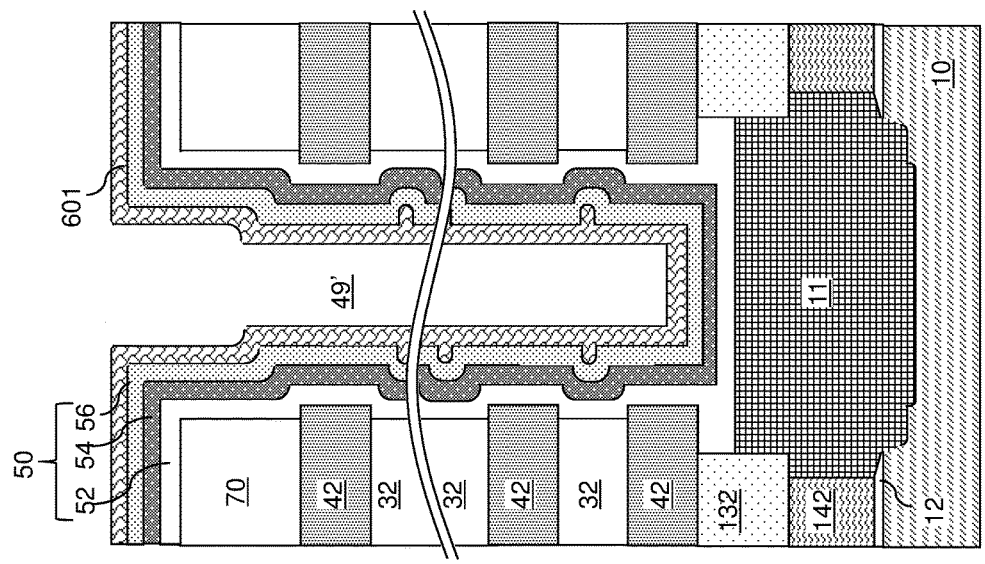

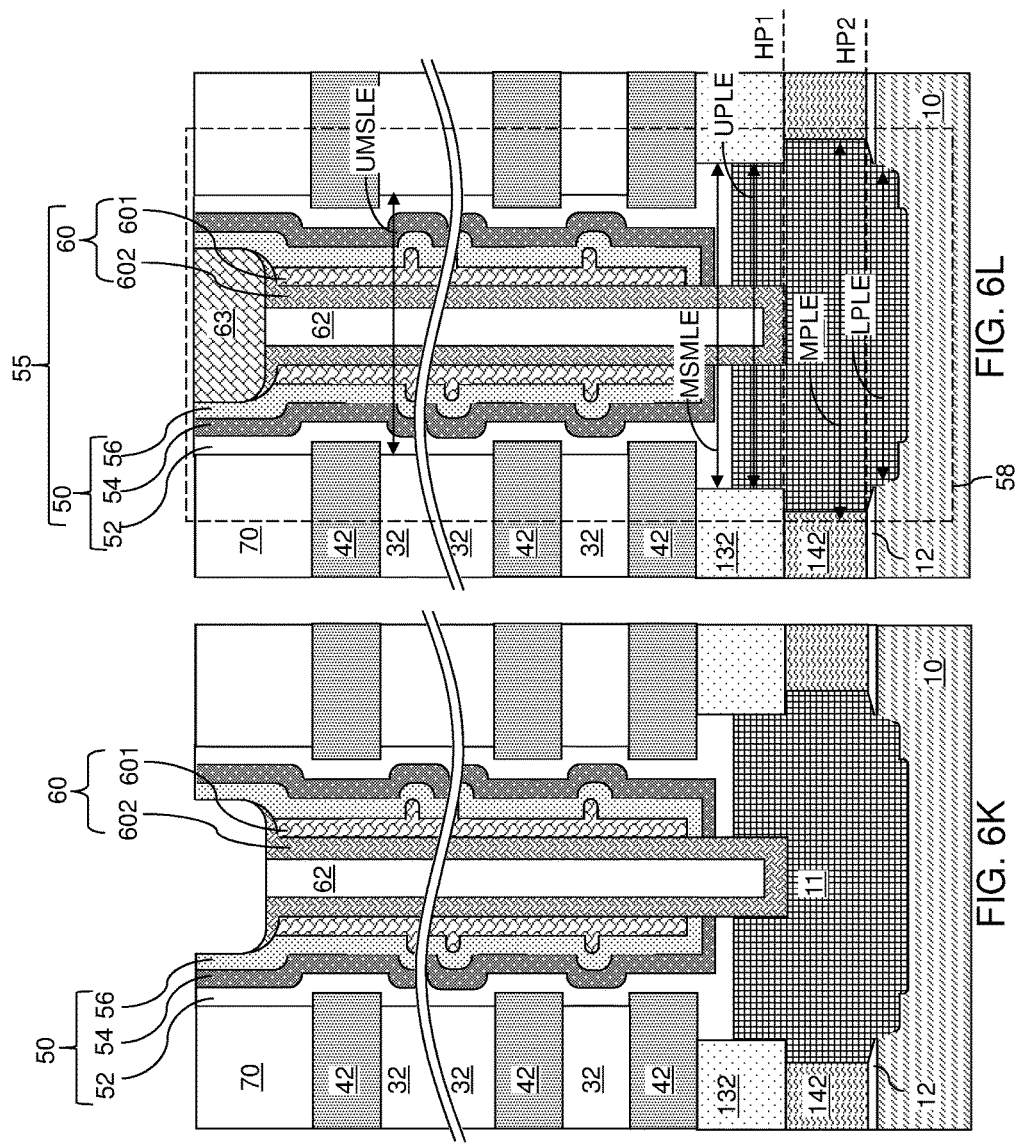

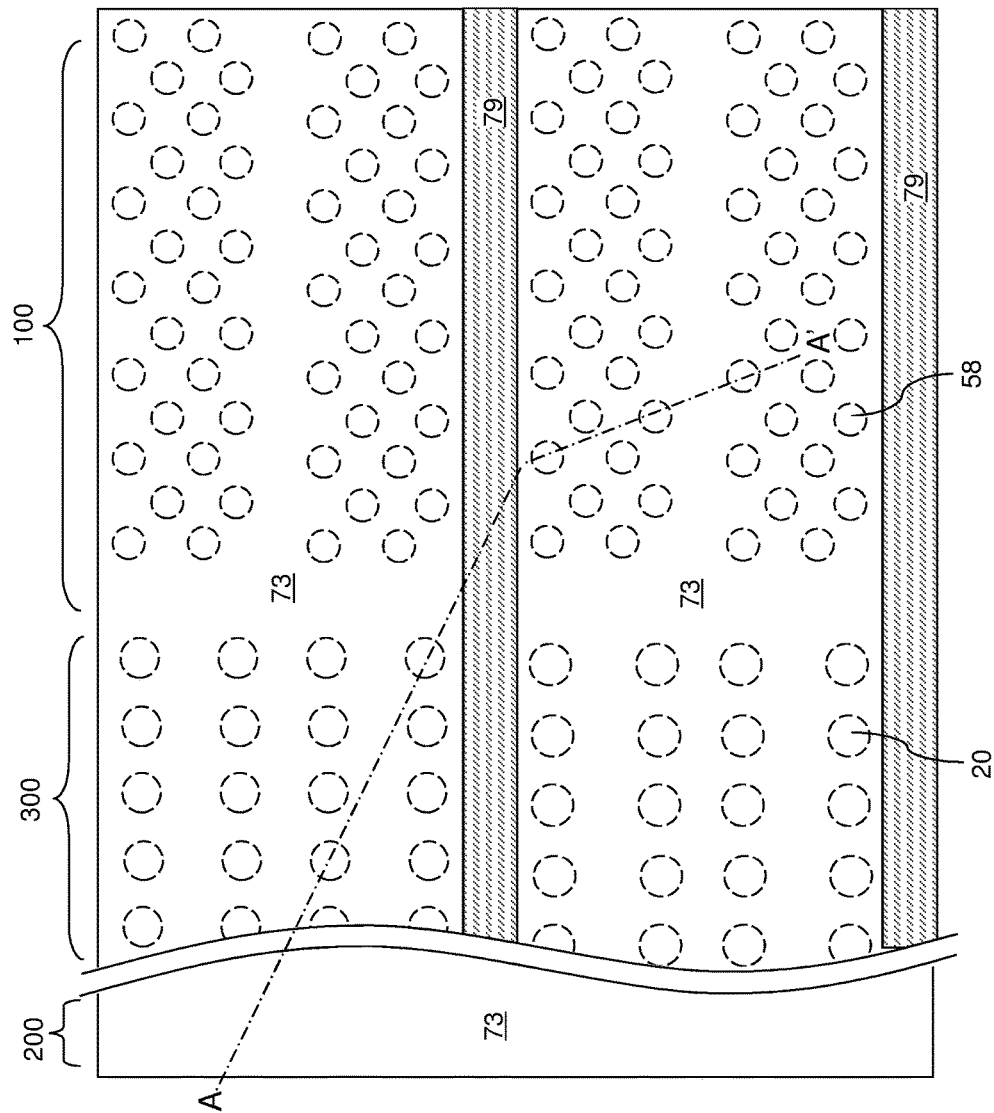

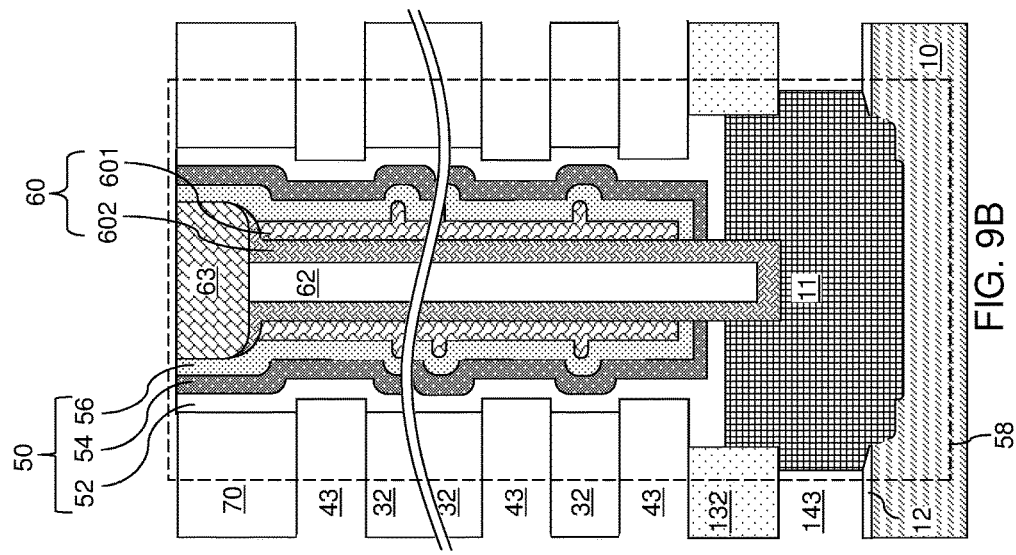

THREE-DIMENSIONAL MEMORY DEVICE CONTAINING STRUCTURALLY REINFORCED PEDESTAL CHANNEL PORTIONS AND METHODS OF MAKING THE SAME

FIELD

The present disclosure relates generally to the field of semiconductor devices, and particular to a three-dimensional memory device employing structurally reinforced pedestal channel portions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, a memory opening extending through the alternating stack, a semiconductor pedestal channel portion located at a bottom portion of the memory opening, and a memory stack structure located in the memory opening and contacting a top surface of the pedestal channel portion. The memory stack structure includes a memory film and a vertical semiconductor channel located inside the memory film. A bottommost insulating layer among the insulating layers comprises a first silicon oxide material, and at least some of the insulating layers other than the bottommost insulating layer comprise a second silicon oxide material having a greater density than the first silicon oxide material.

According to another aspect of the present disclosure, a method of forming a three-dimensional memory device comprises forming an alternating stack of insulating layers and sacrificial material layers over a substrate, wherein a bottommost sacrificial material layer comprises a first sacrificial material, at least some of remaining sacrificial material layers other than the bottommost sacrificial material layer comprise a second sacrificial material that is different from the first sacrificial material, a bottommost insulating layer comprises a first insulating material, and at least some of remaining insulating layers other than the bottommost insulating layer comprise a second insulating material that is different from the first insulating material, forming a memory opening through the alternating stack, laterally recessing the bottommost insulating layer and the bottommost sacrificial material layer selective to the remaining sacrificial material layers and the remaining insulating layers around the memory opening, forming a pedestal channel portion at a bottom portion of the memory opening at a level of the bottommost sacrificial material layer by a selective semiconductor deposition process, forming a memory stack structure in a remaining volume of the memory opening and directly on the pedestal channel portion, wherein the memory stack structure comprises a memory film and a vertical semiconductor channel, and replacing the sacrificial material layers with electrically conductive layers.

BRIEF DESCRIPTION OF THE DRAWINGS

FIGS. 6A-6L are sequential schematic vertical cross-sectional views of a memory opening within the exemplary structure during formation of a memory opening fill structure according to an embodiment of the present disclosure.

FIG. 8B is a partial see-through top-down view of the exemplary structure of FIG. 8A. The vertical plane A-A' is the plane of the schematic vertical cross-sectional view of FIG. 8A.

FIG. 9B is a magnified view of a region of the exemplary structure of FIG. 9A around a memory opening fill structure.

DETAILED DESCRIPTION

Figure 1:
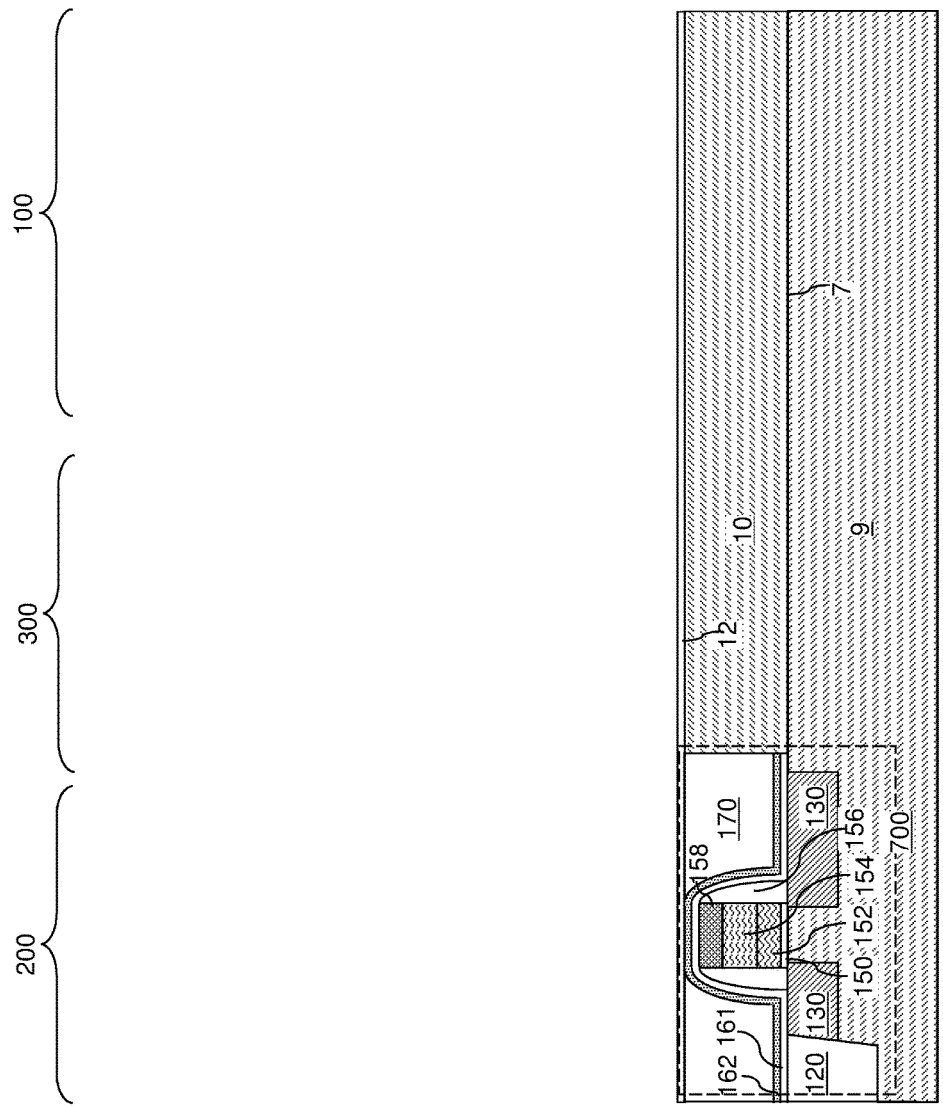
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing structurally reinforced pedestal channel portions and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The various three-dimensional memory devices of the present disclosure include a monolithic three-dimensional NAND string memory device, and can be fabricated employing the various embodiments described herein.

Generally, a semiconductor die, or a semiconductor package, can include be a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

A dielectric layer such as a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
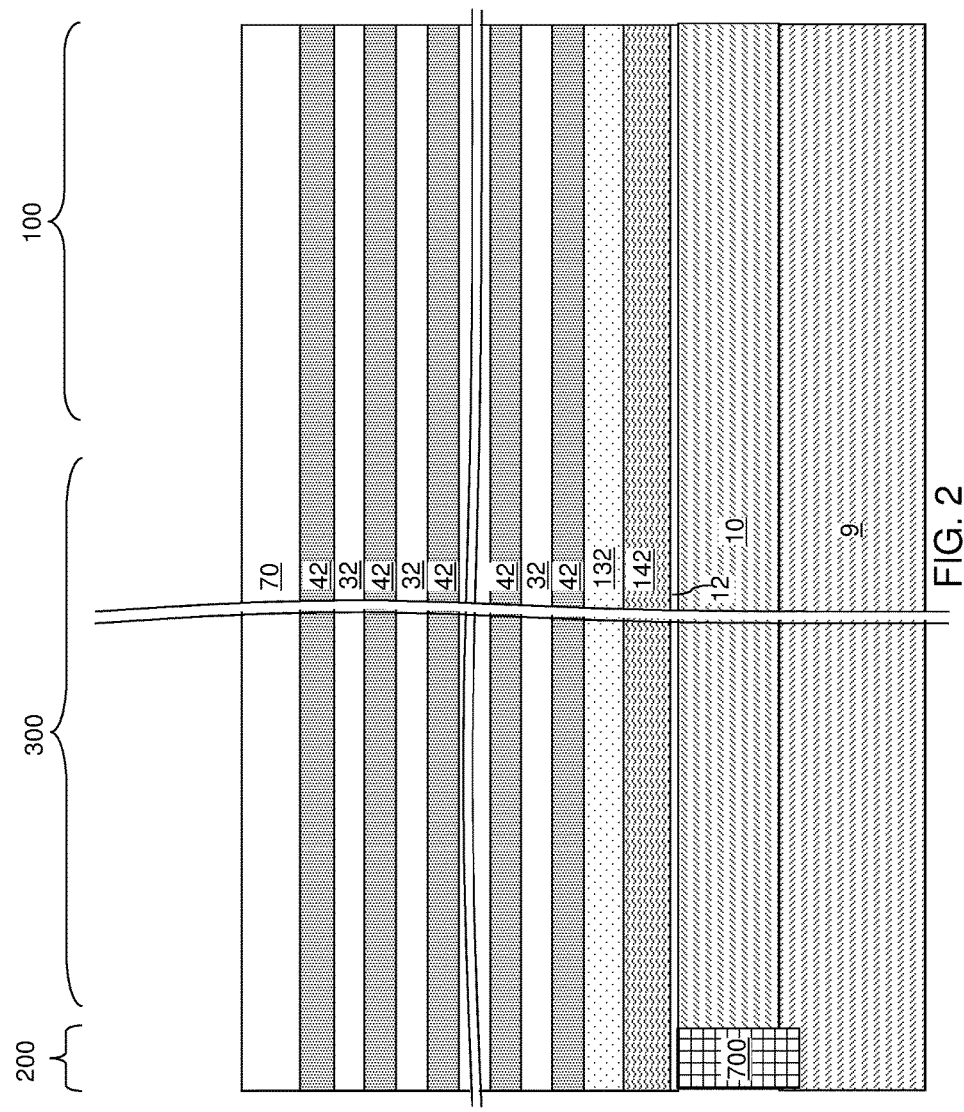
FIG. 2 is a schematic vertical cross-sectional view of the exemplary structure after formation of an alternating stack of insulating layers and sacrificial material layers according to an embodiment of the present disclosure.

Referring to FIG. 2, an alternating stack of insulating layers (132, 32) and sacrificial material layers (142, 42) can be formed over the dielectric layer (such as the gate dielectric layer 12) over the substrate. The bottommost layer of the alternating stack (142, 132, 42, 32) can be a bottommost sacrificial material layer 142, which underlies a bottommost insulating layer 132, which underlies multiple repetitions of pairs of a word-line-level sacrificial material layer 42 and an inter-word-line insulating layer 32. The bottommost sacrificial material layer 142 is formed at the level of a source select gate electrode, and is also referred to as a source-select-level sacrificial material layer. The bottommost insulating layer 132 is formed between word line levels and the level of the source select gate electrode, and is also referred to as a source-select-level isolation insulating layer. Each word-line-level sacrificial material layer 42 overlying the bottommost sacrificial material layer 142 is formed at a word line level, and hence, is herein referred to as a word-line-level sacrificial material layer. Each inter-word-line insulating layer 32 overlying the bottommost inter-word-line insulating layer 132 is formed between levels of word lines, and hence, is herein referred to as an inter-word-line insulating layer. The word-line-level sacrificial material layers 42 and the bottommost sacrificial material layer 142 may be collectively referred to as sacrificial material layers (142, 42). The inter-word-line insulating layers 32 and the bottommost insulating layer 132 may be collectively referred to as insulating layers (132, 32). The alternating stack (142, 132, 42, 32) can include a word-line-level sacrificial material layer 42 as a topmost layer.

The bottommost sacrificial material layer 142 comprises a first sacrificial material, some or all sacrificial material layers other than the bottommost sacrificial material layer 142, i.e., the word-line-level sacrificial material layers 42, comprise a second sacrificial material that is different from the first sacrificial material. The bottommost insulating layer 132 comprises a first insulating material, and some or all insulating layers other than the bottommost insulating layer 132, i.e., the inter-word-line insulating layers 32, comprise a second insulating material that is different from the first insulating material.

In one embodiment, the first sacrificial material of the bottommost sacrificial material layer 142 includes a first silicon nitride material, and the second sacrificial material of the word-line-level sacrificial material layers 42 includes a second silicon nitride material that is different in density and/or composition than the first silicon nitride material. The densities and/or compositions of the first silicon nitride material and the second silicon nitride material are selected such that the first silicon nitride material can be etched at a greater etch rate in a wet etch process (such as buffered hydrofluoric acid) than the second silicon nitride material. In one embodiment, the first silicon nitride material can have a lower density and/or greater nitrogen to silicon atomic ratio than the second silicon nitride material.

The first silicon nitride material can be deposited by a first plasma enhanced silicon nitride deposition process employing silane and nitrogen gas as process gases, and the second silicon nitride material can be deposited by a second plasma enhanced silicon nitride deposition process employing silane and nitrogen gas as process gases. In this case, the second sacrificial material can include the second silicon nitride material having a lesser etch rate in the buffered hydrofluoric acid solution than the first silicon nitride material. As used herein, a buffered hydrofluoric acid solution refers to a solution including a mixture of 40% $NH_4F$ in water and 49% HF in water within a 6:1 volume ratio. The buffered hydrofluoric acid solution is known to etch thermally grown silicon oxide at approximately 2 nanometers per second at 25 degrees Celsius. The etch rate in the buffered hydrofluoric acid solution and the density and/or composition (e.g., the atomic ratio of silicon to nitrogen) in the first and second silicon nitride materials can be controlled by the process conditions in the first and second plasma enhanced silicon nitride deposition processes.

For example, the ratio of the flow rate of nitrogen gas to the flow rate of silane can be lower in the second plasma enhanced silicon nitride deposition process than in the first plasma enhanced silicon nitride deposition process. In this case, the first silicon nitride material of the bottommost sacrificial material layer 142 can be deposited by plasma enhanced chemical vapor deposition process employing $SiH_4$ as a silicon source gas and $N_2$ as a nitrogen source gas such that the ratio of $N_2$ flow to $SiH_4$ flow is in a range from 0.7 to 1.2 such as from 0.8 to 1.1, and the second silicon nitride material of the word-line-level sacrificial material layers 42 can be deposited by plasma enhanced chemical vapor deposition process employing $SiH_4$ as a silicon source gas and $N_2$ as a nitrogen source gas such that the ratio of $N_2$ flow to $SiH_4$ flow is in a range from 0.4 to 0.7 such as from 0.5 to 0.6. Thus, the word-line-level sacrificial material layers 42 can be denser than the bottommost sacrificial material layer 142 and therefore the word-line-level sacrificial material layers 42 can have a lower etch rate than the bottommost sacrificial material layer 142.

In an illustrative example, the plasma enhanced chemical vapor deposition that deposits the first silicon nitride material can be performed in a process chamber that accommodates a 300 mm diameter silicon substrate (which can be employed as the substrate semiconductor layer 9). A total of 22 standard cubic centimeter per minute (sccm) can be flowed for the combination of $N_2$ and $SiH_4$ such that the flow rate of $N_2$ to the flow rate of $SiH_4$ is in a range from 0.7 to 1.2 to deposit the first silicon nitride material at a temperature of about 150 degrees Celsius. About 20 sccm of Argon gas can be flowed as a carrier gas, and the total pressure inside the process chamber can be maintained at about 10 mTorr. As for the second silicon nitride material, a total of 22 standard cubic centimeter per minute (sccm) can be flowed for the combination of $N_2$ and $SiH_4$ such that the flow rate of $N_2$ to the flow rate of $SiH_4$ is in a range from 0.4 to 0.7 to deposit the second silicon nitride material at a temperature of about 150 degrees Celsius. About 20 sccm of Argon gas can be flowed as a carrier gas, and the total pressure inside the process chamber can be maintained at about 10 mTorr. The RF power applied to the process chamber can be about 120 Watts for each of the first and second silicon nitride plasma enhanced chemical vapor deposition processes.

Figure 3A:
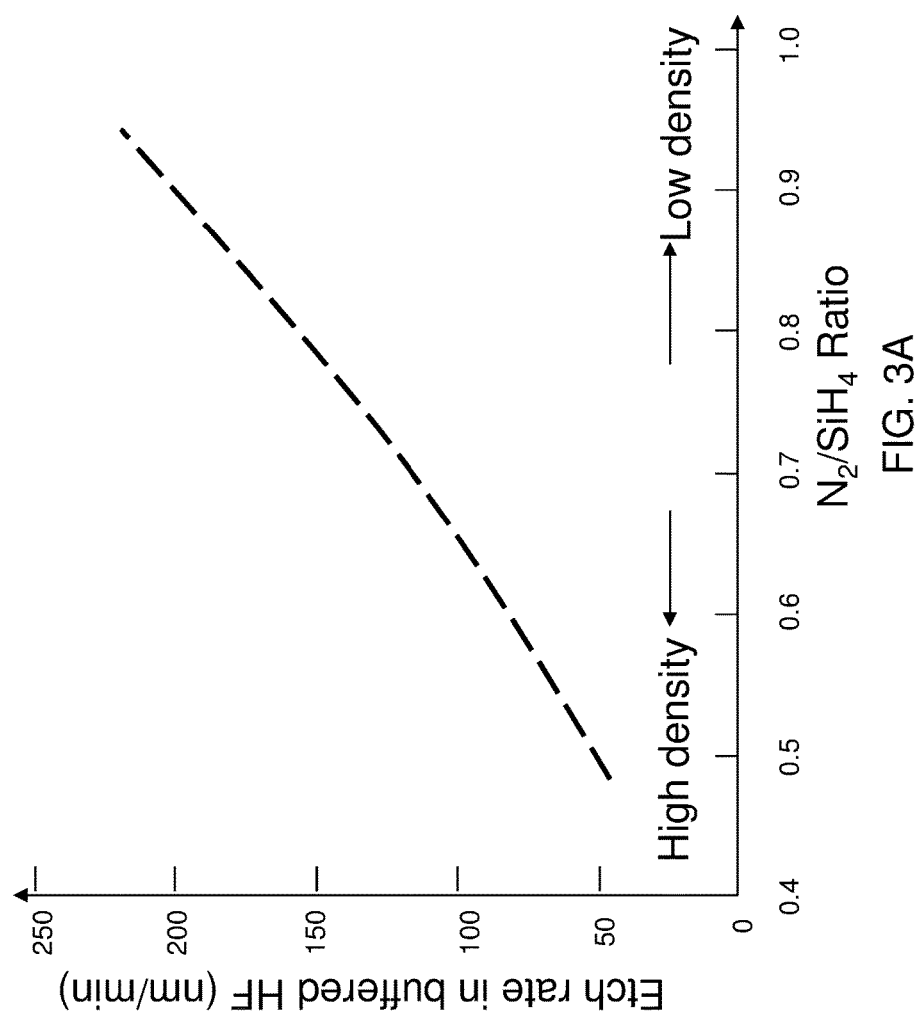
FIG. 3A is a graph illustrating the relationship between the $N_2/SiH_4$ ratio during deposition and the etch rate in buffered hydrofluoric acid solution for silicon nitride.

The etch rate of silicon nitride materials by plasma enhanced chemical vapor deposition employing $N_2$ and $SiH_4$ as process gases in buffered hydrofluoric acid solution formed is shown in FIG. 3A. In one embodiment, the first silicon nitride material can have an etch rate in the buffered hydrofluoric acid solution in a range from 100 nm/min to 250 nm/min, and the second silicon nitride material can have an etch rate in the buffered hydrofluoric acid solution in a range from 20 nm/min to 50 nm/min, although different ranges may be selected provided that the second silicon nitride material has a lesser etch rate in the buffered hydrofluoric acid solution.

In one embodiment, the first insulating material of the bottommost insulating layer 132 includes a first silicon oxide material, and the second insulating material of the inter-word-line insulating layers 32 includes a second silicon oxide material that is different in density and/or composition than the first silicon oxide material. The densities and/or compositions of the first silicon oxide material and the second silicon oxide material are selected such that the first silicon oxide material can be etched at a greater etch rate in a wet etch process (such as a HF wet etch process) than the second silicon oxide material. In one embodiment, the first silicon oxide material can have a lower density and/or greater oxygen to silicon atomic ratio than the second silicon oxide material.

The first silicon oxide material can be deposited by a first plasma enhanced silicon oxide deposition process employing silane and oxygen gas as process gases, and the second silicon oxide material can be deposited by a second plasma enhanced silicon oxide deposition process employing silane and oxygen gas as process gases. In this case, the second insulating material can include the second silicon oxide material having a lesser etch rate in the buffered hydrofluoric acid solution than the first silicon oxide material. The etch rate in the buffered hydrofluoric acid solution and the density and/or composition (e.g., the atomic ratio of silicon to oxygen), in the first and second silicon oxide materials can be controlled by the process conditions in the first and second plasma enhanced silicon oxide deposition processes.

For example, the ratio of the flow rate of oxygen gas to the flow rate of silane can be lower in the second plasma enhanced silicon oxide deposition process than in the first plasma enhanced silicon oxide deposition process. In this case, the first silicon oxide material of the bottommost insulating layer 132 can be deposited by plasma enhanced chemical vapor deposition process employing $SiH_4$ as a silicon source gas and $O_2$ as an oxygen source gas such that the ratio of $O_2$ flow to $SiH_4$ flow is in a range from 1.1 to 1.4 such as from 1.2 to 1.3, and the second silicon oxide material of the inter-word-line insulating layers 32 can be deposited by plasma enhanced chemical vapor deposition process employing $SiH_4$ as a silicon source gas and $O_2$ as an oxygen source gas such that the ratio of $O_2$ flow to $SiH_4$ flow is in a range from 0.7 to 1.0 such as from 0.8 to 0.9.

In an illustrative example, the plasma enhanced chemical vapor deposition that deposits the first silicon oxide material can be performed in a process chamber that accommodates a 300 mm diameter silicon substrate (which can be employed as the substrate semiconductor layer 9). The $SiH_4$ flow rate can be 40 sccm, and the flow rate of $O_2$ can be in a range from 44 sccm to 56 sccm. The process temperature can be about 100 degrees Celsius, and the process pressure can be about 10 mTorr. As for the second silicon oxide material, the $SiH_4$ flow rate can be 40 sccm, and the flow rate of $O_2$ can be in a range from 28 sccm to 40 sccm. The process temperature can be about 100 degrees Celsius, and the process pressure can be about 10 mTorr. The RF power applied to the process chamber can be about 50 Watts for each of the first and second silicon nitride plasma enhanced chemical vapor deposition processes.

Figure 3B:
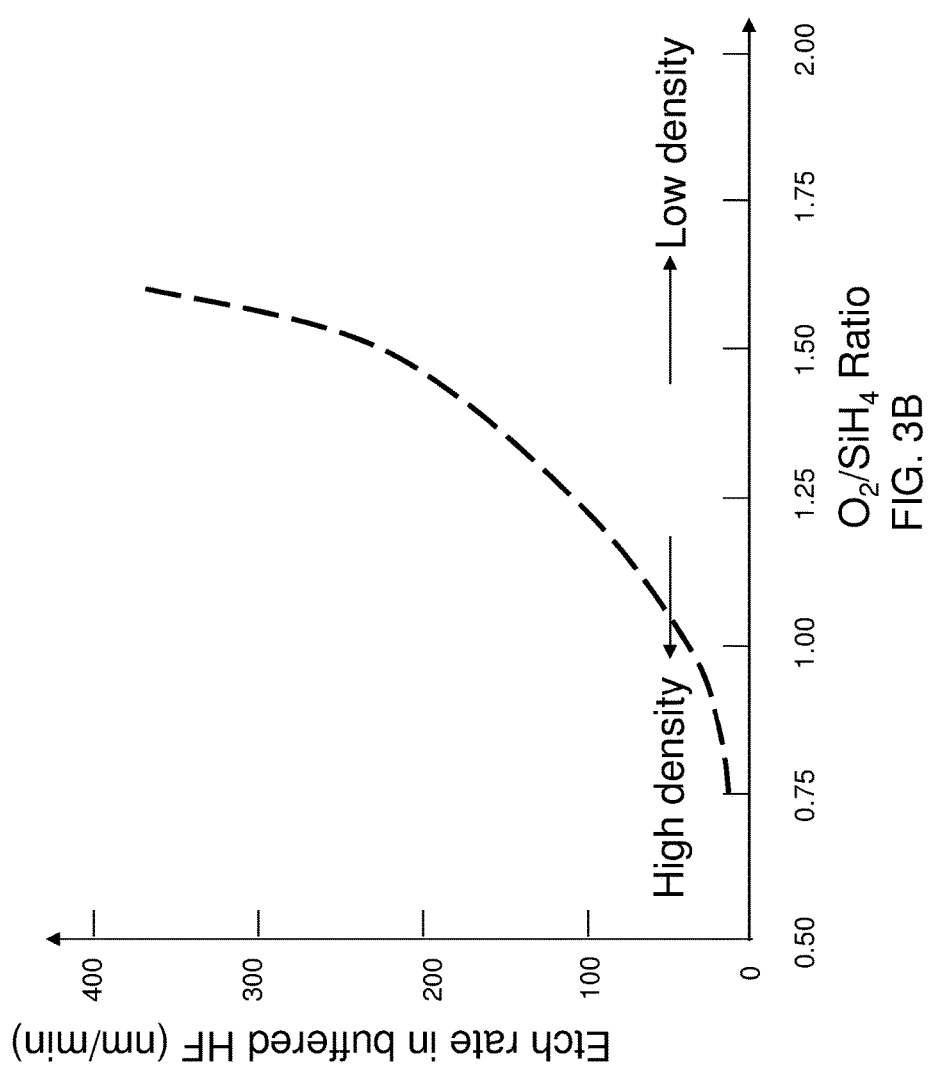
FIG. 3B is a graph illustrating the relationship between the $O_2/SiH_4$ ratio during deposition and the etch rate in buffered hydrofluoric acid solution for silicon oxide.

The etch rate of silicon oxide materials by plasma enhanced chemical vapor deposition employing $O_2$ and $SiH_4$ as process gases in buffered hydrofluoric acid solution formed is shown in FIG. 3B. In one embodiment, the first silicon oxide material can have an etch rate in the buffered hydrofluoric acid solution in a range from 50 nm/min to 170 nm/min, and the second silicon oxide material can have an etch rate in the buffered hydrofluoric acid solution in a range from 10 nn/min to 30 nm/min, although different ranges may be selected provided that the second silicon oxide material has a lesser etch rate in the buffered hydrofluoric acid solution.

In one embodiment, the first silicon nitride material of the bottommost sacrificial material layer 142 can have a greater etch rate in the buffered hydrofluoric acid than the second silicon oxide material of the inter-word-line insulating layers 32. Additionally, the first silicon oxide material of the bottommost insulating layer 132 can have a lesser etch rate in the buffered hydrofluoric acid than the first silicon nitride material of the bottommost sacrificial material layer 142, and have a greater etch rate in the buffered hydrofluoric acid than the second silicon oxide material of the inter-word-line insulating layers 32.

The thickness of the bottommost sacrificial material layer 142 can be in a range from 20 nm to 80 nm, although lesser and greater thicknesses can also be employed. The thickness of the bottommost insulating layer 132 can be in a range from 20 nm to 200 nm, although lesser and greater thicknesses can also be employed. The thicknesses of the inter-word-line insulating layers 32 and the word-line-level sacrificial material layers 42 can be in a range from 20 nm to 50 nm, although lesser and greater thicknesses can be employed for each inter-word-line insulating layer 32 and for each word-line-level sacrificial material layer 42. The number of repetitions of the pairs of an inter-word-line insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each word-line-level sacrificial material layer 42 in the alternating stack (142, 132, 42, 32) can have a uniform thickness that is substantially invariant within each respective word-line-level sacrificial material layer 42.

An insulating cap layer 70 can be formed over the alternating stack (142, 132, 42, 32). The insulating cap layer 70 includes a dielectric material that is different from the material of the word-line-level sacrificial material layers 42. In one embodiment, the insulating cap layer 70 can include a dielectric material that can be employed for the inter-word-line insulating layers 32 as described above. The insulating cap layer 70 can have a greater thickness than each of the inter-word-line insulating layers 32. The insulating cap layer 70 can be deposited, for example, by chemical vapor deposition. In one embodiment, the insulating cap layer 70 can be a silicon oxide layer.

Figure 4:
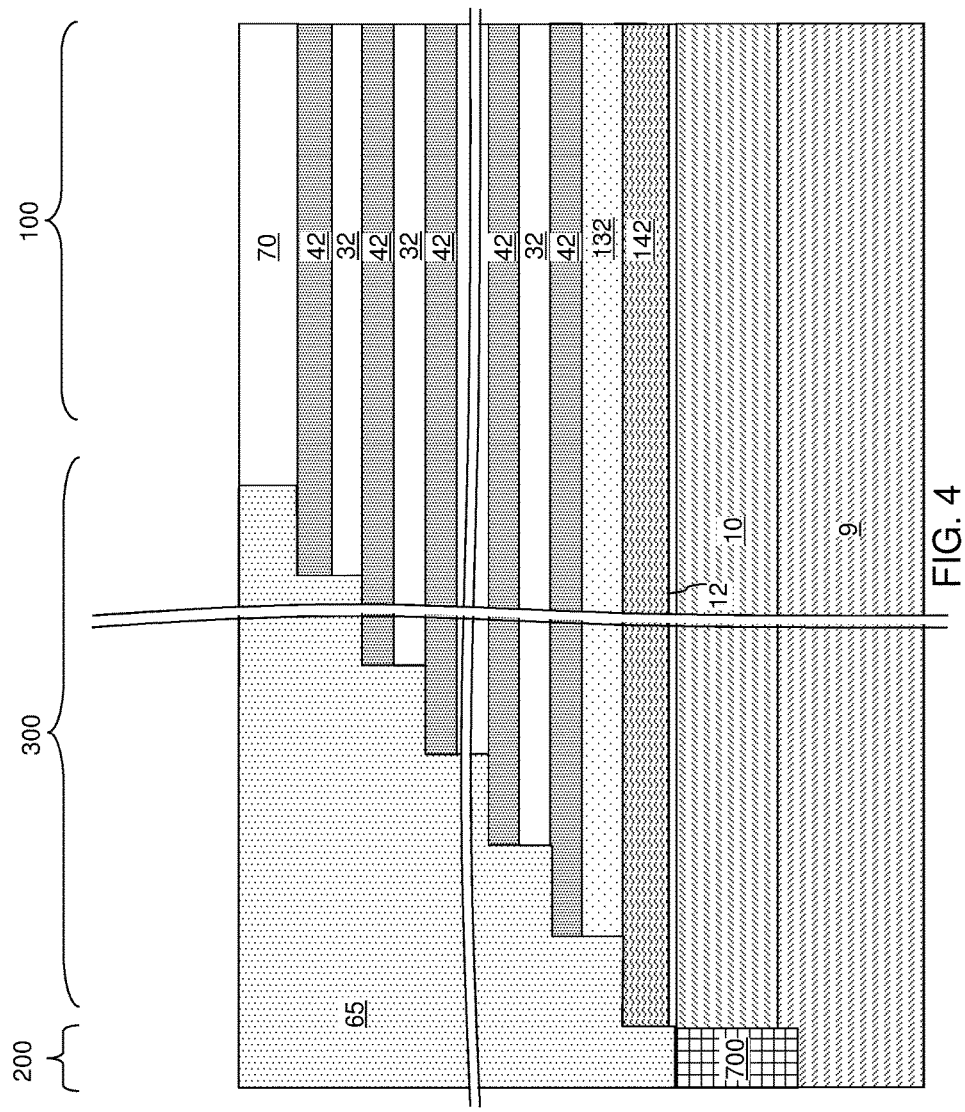
FIG. 4 is a schematic vertical cross-sectional view of the exemplary structure after formation of stepped terraces and a retro-stepped dielectric material portion according to an embodiment of the present disclosure.

Referring to FIG. 4, a stepped cavity can be formed within the contact region 300 which is located between the memory array region (e.g., memory plane) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (142, 132, 42, 32) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (142, 132, 42, 32). Each word-line-level sacrificial material layer 42 other than a topmost word-line-level sacrificial material layer 42 within the alternating stack (142, 132, 42, 32) laterally extends farther than any overlying word-line-level sacrificial material layer 42 within the alternating stack (142, 132, 42, 32). The terrace region includes stepped surfaces of the alternating stack (142, 132, 42, 32) that continuously extend from a bottommost layer, i.e., the bottommost sacrificial material layer 142, within the alternating stack (142, 132, 42, 32) to a topmost layer within the alternating stack (142, 132, 42, 32). The gate dielectric layer 12 can be patterned to extend the stepped surfaces to the top surface of the substrate (9, 10).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the word-line-level sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 5A:
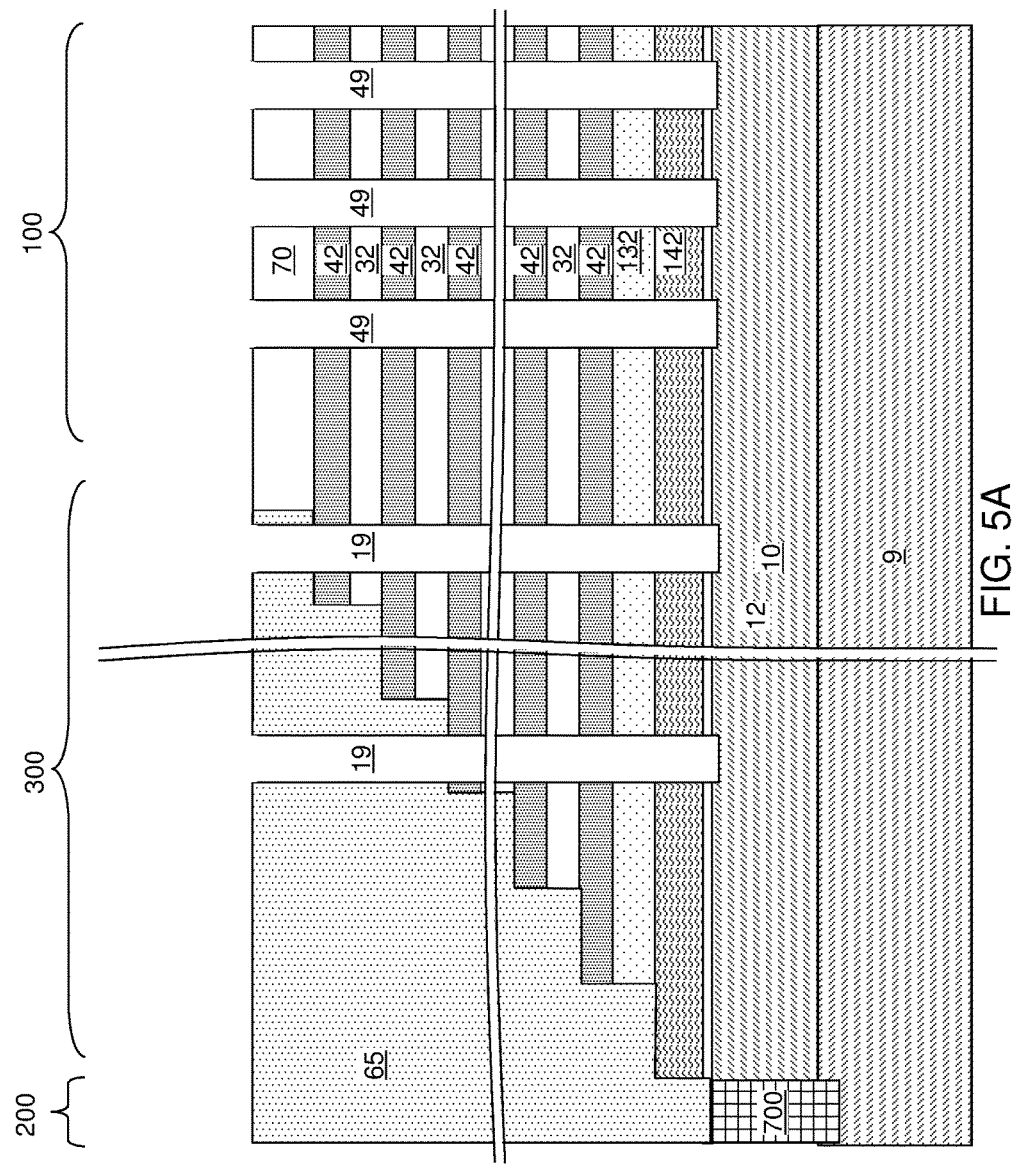
FIG. 5A is a schematic vertical cross-sectional view of the exemplary structure after formation of memory openings and support openings according to an embodiment of the present disclosure.
Figure 5B:
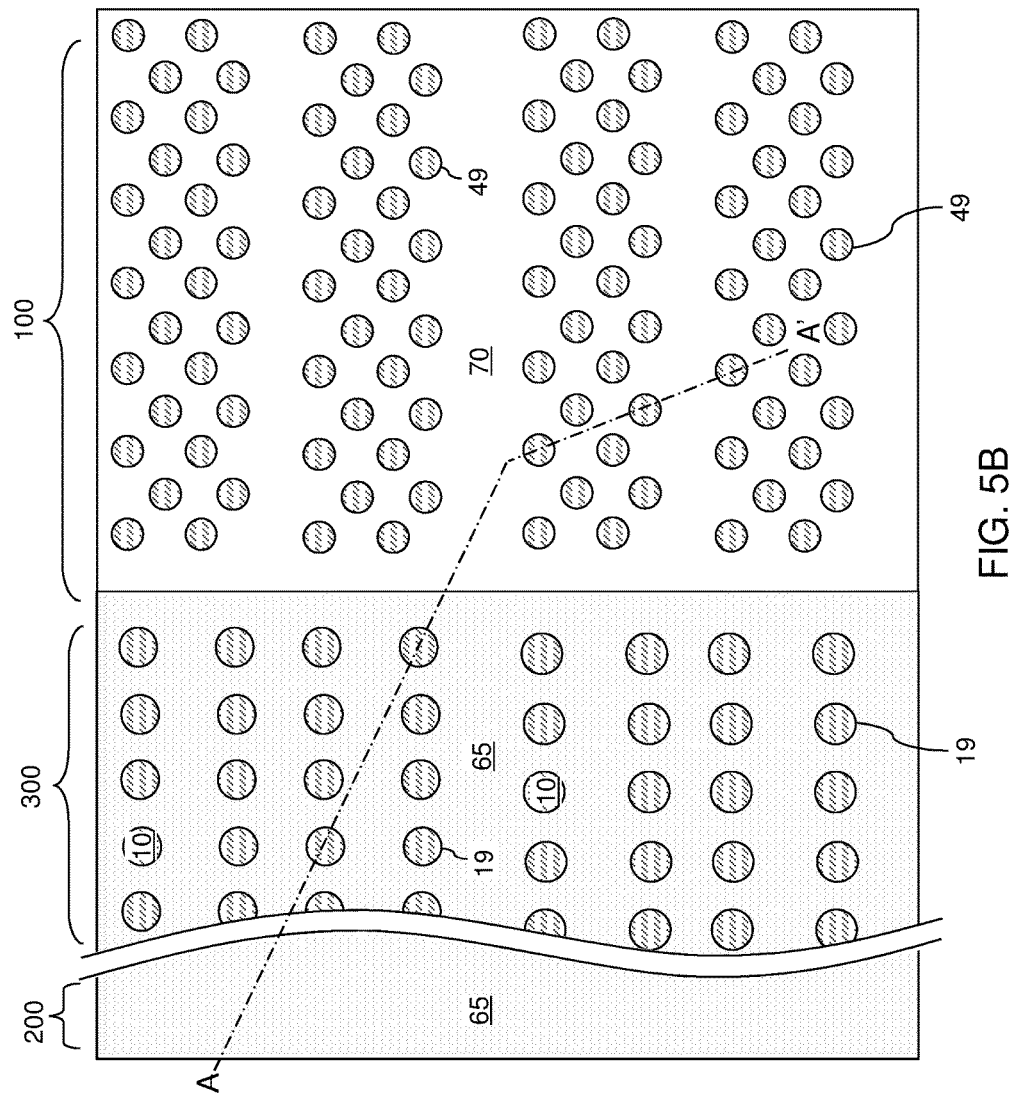
FIG. 5B is a top-down view of the exemplary structure of FIG. 5A. The vertical plane A-A' is the plane of the cross-section for FIG. 5A.

Referring to FIGS. 5A and 5B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (142, 132, 42, 32) by at least one anisotropic etch that employs the patterned lithographic material stack as an etch mask. Portions of the alternating stack (142, 132, 42, 32) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (142, 132, 42, 32) in the memory array region 100. The support openings 19 are formed through the retro-stepped dielectric material portion 65 and the portion of the alternating stack (142, 132, 42, 32) that underlie the stepped surfaces in the contact region 300.

The memory openings 49 extend through the entirety of the alternating stack (142, 132, 42, 32). The support openings 19 extend through a subset of layers within the alternating stack (142, 132, 42, 32). The chemistry of the anisotropic etch process employed to etch through the materials of the alternating stack (142, 132, 42, 32) can alternate to optimize etching of the first and second materials in the alternating stack (142, 132, 42, 32). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (142, 132, 42, 32) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. Each memory opening 49 has a substantially cylindrical initial volume, which is herein referred to as an initial memory opening volume. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 6A-6L illustrate structural changes in a memory opening 49, which is one of the memory openings 49 in the exemplary structure of FIGS. 5A and 5B. The same structural change occurs simultaneously in each of the other memory openings 49 and in each support opening 19.

Referring to FIG. 6A, a memory opening 49 in the exemplary device structure of FIGS. 5A and 5B is illustrated. The memory opening 49 extends through the insulating cap layer 70, the alternating stack (142, 132, 42, 32), and the gate dielectric layer 12, and optionally into an upper portion of the semiconductor material layer 10. At this processing step, the support openings 19 can extend through the retro-stepped dielectric material portion 65, a subset of layers in the alternating stack (142, 132, 42, 32), and the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. A recessed top surface, and optionally sidewalls, of the semiconductor material layer 10 is physically exposed at the bottom of the memory opening 49 upon formation of the memory openings 49.

Referring to FIG. 6B, a carbon-doped portion 102 can be optionally formed in an upper portion of the substrate, for example, in a surface portion of the semiconductor material layer 10, by implanting carbon atoms into a semiconductor material in the substrate underneath each memory opening 49. Each carbon-doped portion 102 can function as an oxidation retardation structure that reduces oxidation of a surface portion of the semiconductor material layer 10 in a subsequent oxidation process.

A semiconductor oxide plate 114 can be formed by oxidizing a surface portion of the carbon-doped portion 102 by an oxidation process, which can be a thermal oxidation process or a plasma oxidation process. The thickness of the semiconductor oxide plate 114 can be in a range from 1 nm to 10 nm. The semiconductor oxide plate can include, for example, a carbon-doped silicon oxide material. The remaining portion of the carbon-doped portion 102 can have a thickness in a range from 2 nm to 30 nm, although lesser and greater thicknesses can also be employed.

Referring to FIG. 6C, an isotropic etch process can be performed to laterally recess the bottommost sacrificial material layer 142, and the bottommost insulating layer 132 selective to the word-line-level sacrificial material layers 42 and selective to the inter-word-line insulating layers 32, which are located at word line levels. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

For example, a wet etch employing a diluted buffered hydrofluoric acid solution can be employed to etch the materials of the bottommost sacrificial material layer 142, and the bottommost insulating layer 132. The diluted buffered hydrofluoric acid solution can be obtained by diluting a buffered hydrofluoric acid solution with deionized water. For example, 10:1 to 30:1 dilution in deionized water can be performed on a buffered hydrofluoric acid solution to provide an etchant for laterally recessing the bottommost sacrificial material layer 142, and the bottommost insulating layer 132. Alternatively, a dilute hydrofluoric acid solution may be employed in lieu of a diluted buffered hydrofluoric acid solution. The bottommost insulating layer 132 and the bottommost sacrificial material layer 142 can be laterally recessed selective to the word-line-level sacrificial material layers 42 and selective to the inter-word-line insulating layers 32 around each memory opening 49.

The inter-word-line insulating layers 32, the insulating cap layer 70, the semiconductor oxide plates 114, and physically exposed portions of the gate dielectric layer 12 can be collaterally etched by the isotropic etch process that laterally recesses the bottommost insulating layer 132 and the bottommost sacrificial material layer 142. Each semiconductor oxide plate 114 can be completely removed during the isotropic etch process that that laterally recesses the bottommost insulating layer 132 and the bottommost sacrificial material layer 142.

Because the inner sidewall of the bottommost sacrificial material layer 142 is laterally recessed with a finite speed (which is the etch rate), a portion of the gate dielectric layer 12 around each memory opening 49 that is more proximal to an original sidewall of the gate dielectric layer 12 as provided at the processing steps of FIG. 6A is exposed to the etchant of the isotropic etch process for a longer time than a lesser proximal portion of the gate dielectric layer 12 around each memory opening 49. Thus, a tapered annular surface can be formed on the gate dielectric layer 12 around each opening through the gate dielectric layer 12 (i.e., around each memory opening 49 and around each support opening 19) while laterally recessing the bottommost insulating layer 132 and the bottommost sacrificial material layer 142.

In one embodiment, the lateral recess distance of the bottommost sacrificial material layer 142 can be greater than the lateral recess distance of the bottommost insulating layer 132. The lateral recess distance of the bottommost insulating layer 132 can be greater than the lateral recess distance of the inter-word-line insulating layers 32 that is induced by collateral etching during the isotropic etch process. The lateral etch distance of the inter-word-line insulating layers 32 induced by collateral etching during the isotropic etch process can be insignificant compared to the lateral recess distance of the bottommost sacrificial material layer 142. Further, the lateral etch distance of the word-line-level sacrificial material layers 42 induced by collateral etching during the isotropic etch process can be insignificant compared to the lateral recess distance of the bottommost sacrificial material layer 142. For example, the lateral recess distance of the bottommost sacrificial material layer 142 can be in a range from 30 nm to 200 nm, the lateral recess distance of the bottommost insulating layer 132 can be in a range from 15 nm to 100 nm, the lateral recess distance of the inter-word-line insulating layers 32 can be in a range from 3 nm to 30 nm, and the lateral recess distance of the word-line-level sacrificial material layers 42 can be in a range from 3 nm to 30 nm. The lateral recess distance of the inter-word-line insulating layers 32 may be greater than, the same as, or less than, the lateral recess distance of the word-line-level sacrificial material layers 42. Thus, the sidewalls of the stack of the inter-word-line insulating layers 32 and the word-line-level sacrificial material layers 42 may be straight, or may be undulated due to unequal lateral recess distances between the inter-word-line insulating layers 32 and the word-line-level sacrificial material layers 42.

Referring to FIG. 6D, the carbon-doped portion 102 can be removed by an anisotropic etch process from the bottom of each memory opening 49. The anisotropic etch process can employ a plasma of $Cl_2$ gas, which can etch the carbon-doped silicon material of the carbon-doped portion 102. A semiconductor surface that is substantially carbon-free can be physically exposed at the bottom of each memory opening. The entire physically exposed semiconductor surface of the semiconductor material layer 10 can be substantially free of carbon or other contaminants after the anisotropic etch process, which functions as a surface clean process in preparation for a subsequent epitaxial semiconductor deposition process.

Referring to FIG. 6E, a pedestal channel portion 11 can be formed at the bottom portion of each memory opening 49 and each support openings 19 by a selective semiconductor deposition process. In one embodiment, the selective semiconductor deposition process may be a selective epitaxy process. If the semiconductor material layer 10 includes a single crystalline material, each pedestal channel portion 11 comprises a single crystalline semiconductor material in epitaxial alignment with the single crystalline semiconductor material of the semiconductor material layer 10. Alternatively, the semiconductor material layer 10 may be polycrystalline, and the pedestal channel portions 11 may be polycrystalline.

In one embodiment, the pedestal channel portion 11 can be doped with electrical dopants of the same conductivity type as the semiconductor material layer 10. In one embodiment, the top surface of each pedestal channel portion 11 can be formed on a sidewall of the bottommost insulating layer 132. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon or polycrystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Each pedestal channel portion 11 can be formed at a bottom portion of the memory opening 49 at a level of the bottommost sacrificial material layer 142 by a selective semiconductor deposition process. Each pedestal channel portion 11 has an upper pedestal lateral extent UPLE, which is a maximum lateral extent of an entire portion of the pedestal channel portion 11 above a first horizontal plane HP1 including a bottom surface of the bottommost insulating layer 132 and a top surface of the bottommost sacrificial material layer 142. As used herein, a "maximum lateral extent" or a "maximum lateral dimension" is the maximum of all measurable lateral extents or the maximum of all measurable lateral dimensions. Each lateral extent and each lateral dimension is measured within a respective horizontal plane that is parallel to the top surface of the substrate (9, 10). Each pedestal channel portion 11 has a middle pedestal lateral extent MPLE, which is a maximum lateral extent of the pedestal channel portion 11 between the first horizontal plane HP1 and a second horizontal plane HP2 including a top surface of the gate dielectric layer 12 and bottom surface of the bottommost sacrificial material layer 142. The middle pedestal lateral extent MPLE can be greater than upper pedestal lateral extent UPLE. The pedestal channel portion 11 can have a lower pedestal lateral extent LPLE, which is a maximum lateral extent of the pedestal channel portion below the second horizontal plane HP2.

Referring to FIG. 6F, a stack of layers including a blocking dielectric layer 52, a charge storage layer 54, and a tunneling dielectric layer 56 can be sequentially deposited in the memory openings 49. If the sidewalls of the inter-word-line insulating layers 32 and the word-line-level sacrificial material layers 42 have a laterally undulating profile, each layer within the stack of layers including the blocking dielectric layer 52, the charge storage layer 54, and the tunneling dielectric layer 56 can have a laterally undulating profile. The stack of layers including the blocking dielectric layer 52, the charge storage layer 54, and the tunneling dielectric layer 56 constitutes a memory film 50.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into word-line-level sacrificial material layers 42. In one embodiment, the charge storage layer 54 includes a silicon nitride layer. In one embodiment, the word-line-level sacrificial material layers 42 and the inter-word-line insulating layers 32 can have vertically coincident sidewalls, and the charge storage layer 54 can be formed as a single continuous layer.

In another embodiment, the word-line-level sacrificial material layers 42 can be laterally recessed with respect to the sidewalls of the inter-word-line insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Referring to FIG. 6G, an optional first semiconductor channel layer 601 can be subsequently deposited. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6H, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the word-line-level sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 6I:
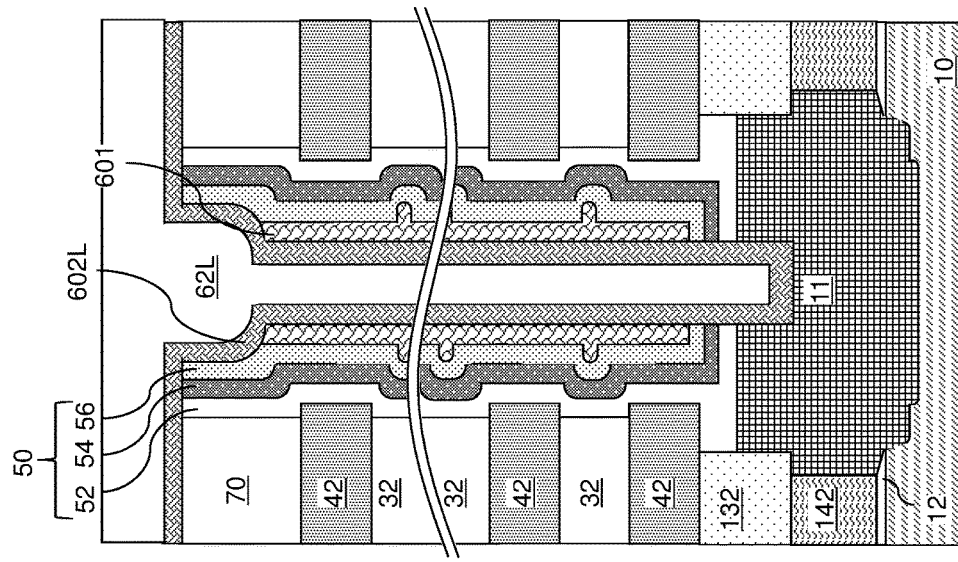

Referring to FIG. 6I, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 6J:
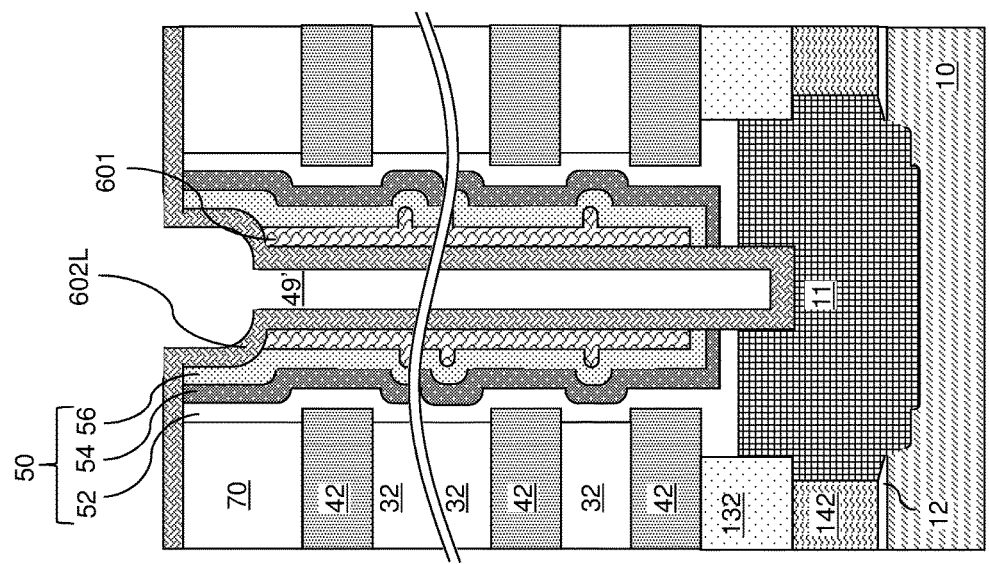

Referring to FIG. 6J, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6K, the horizontal portion of the dielectric core layer 62L can be removed, for example, by a recess etch from above the top surface of the insulating cap layer 70. The dielectric core layer 62L can be further recessed so that remaining portions of the dielectric core layer 62 have a top surface between the horizontal plane including the top surface of the insulating cap layer 70 and the horizontal plane including the bottom surface of the insulating cap layer 70. Each remaining portion of the dielectric core layer 62L constitutes a dielectric core 62. Subsequently, the second semiconductor channel layer 602 can be vertically recessed such that each remaining portion of the second semiconductor channel layer 602 has a top surface between the horizontal plane including the top surface of the insulating cap layer 70 and the horizontal plane including the bottom surface of the insulating cap layer 70. Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 6L, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

An upper memory stack structure lateral extent UMSLE is defined as a maximum lateral extent of an entire portion of the memory stack structure 55 that is located above the horizontal plane including the top surface of the bottommost insulating layer 132. A memory stack structure maximum lateral extent MSMLE is defined as the maximum lateral extent of the entirety of the memory stack structure 55. The memory stack structure maximum lateral extent MSMLE occurs at the level of the bottommost insulating layer 132. The memory stack structure maximum lateral extent MSMLE can be the same as the upper pedestal lateral extent UPLE. The upper memory stack structure lateral extent UMSLE is less than the memory stack structure maximum lateral extent MSMLE, and thus, is less than the upper pedestal lateral extent UPLE. The middle pedestal lateral extent MPLE can be greater than upper memory stack structure lateral extent UMSLE, and the lower pedestal lateral extent LPLE can be greater than the upper memory stack structure lateral extent UMSLE.

Figure 7:
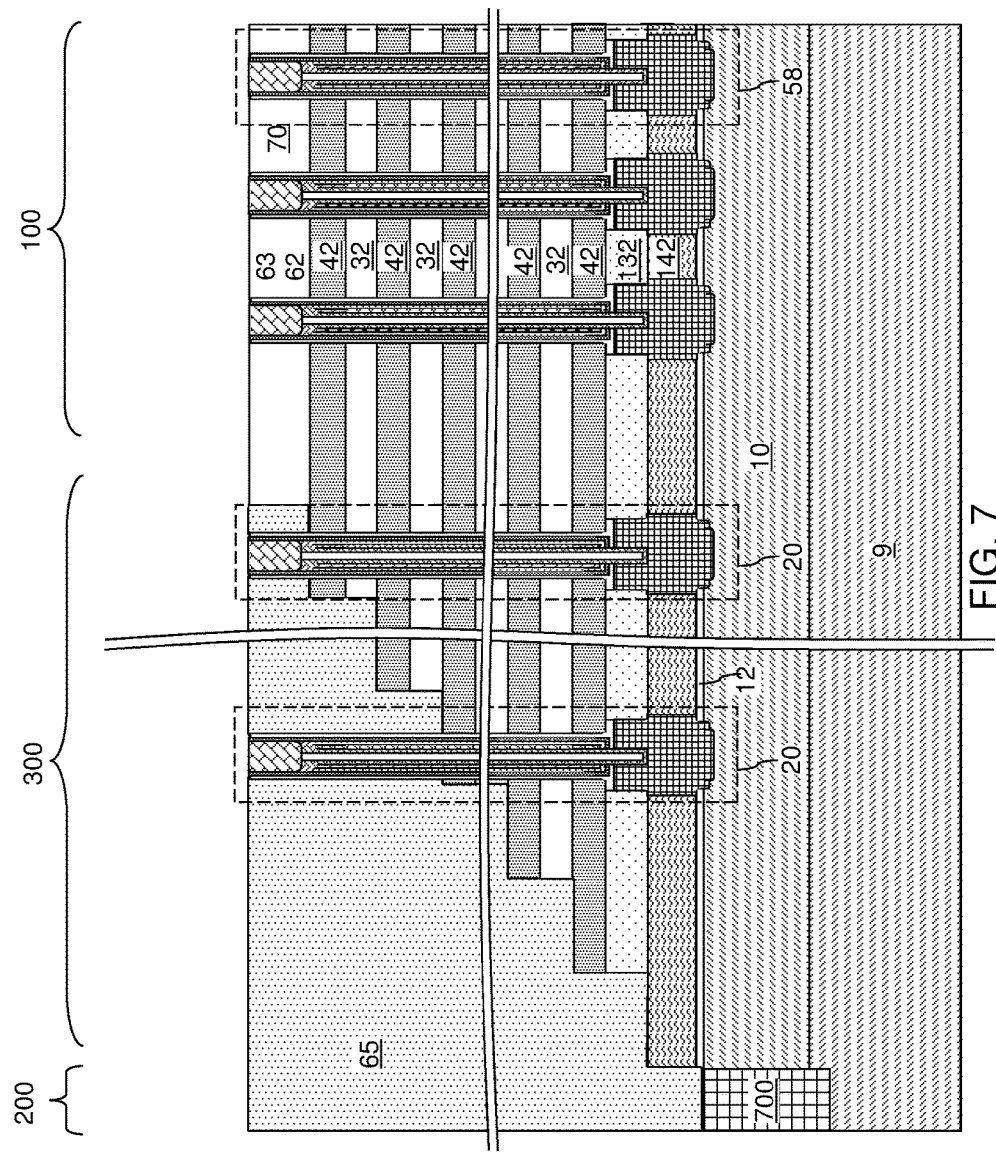
FIG. 7 is a schematic vertical cross-sectional view of the exemplary structure after formation of memory stack structures and support pillar structures according to an embodiment of the present disclosure.

Referring to FIG. 7, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 5A and 5B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 8A:
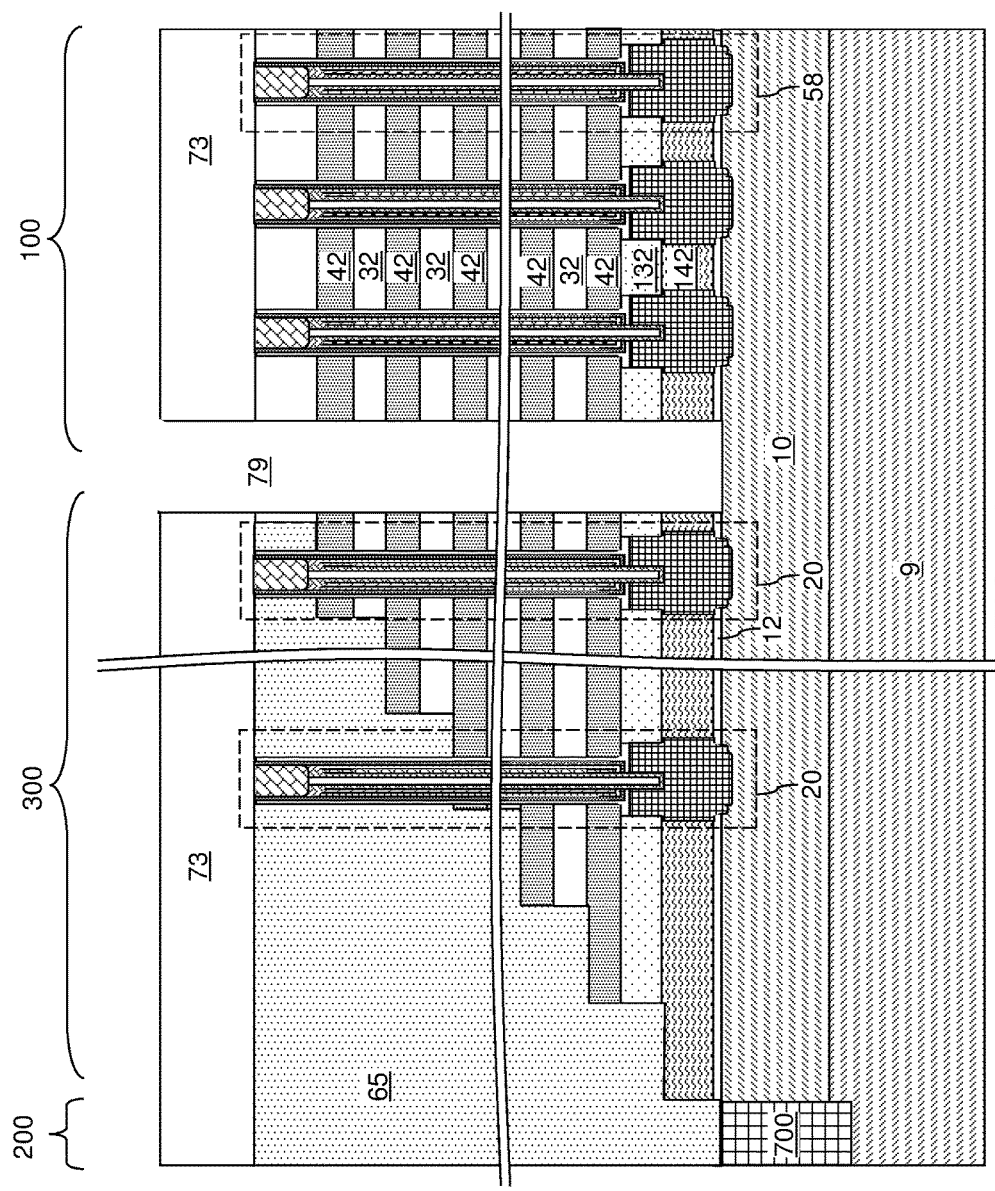
FIG. 8A is a schematic vertical cross-sectional view of the exemplary structure after formation of backside trenches according to an embodiment of the present disclosure.

Referring to FIGS. 8A and 8B, a contact level dielectric layer 73 can be formed over the alternating stack (142, 132, 42, 32) of inter-word-line insulating layer 32 and word-line-level sacrificial material layers 42, and over the memory stack structures 55 and the support pillar structures 20. The contact level dielectric layer 73 includes a dielectric material that is different from the dielectric material of the word-line-level sacrificial material layers 42. For example, the contact level dielectric layer 73 can include silicon oxide.

The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (142, 132, 42, 32) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 9A:
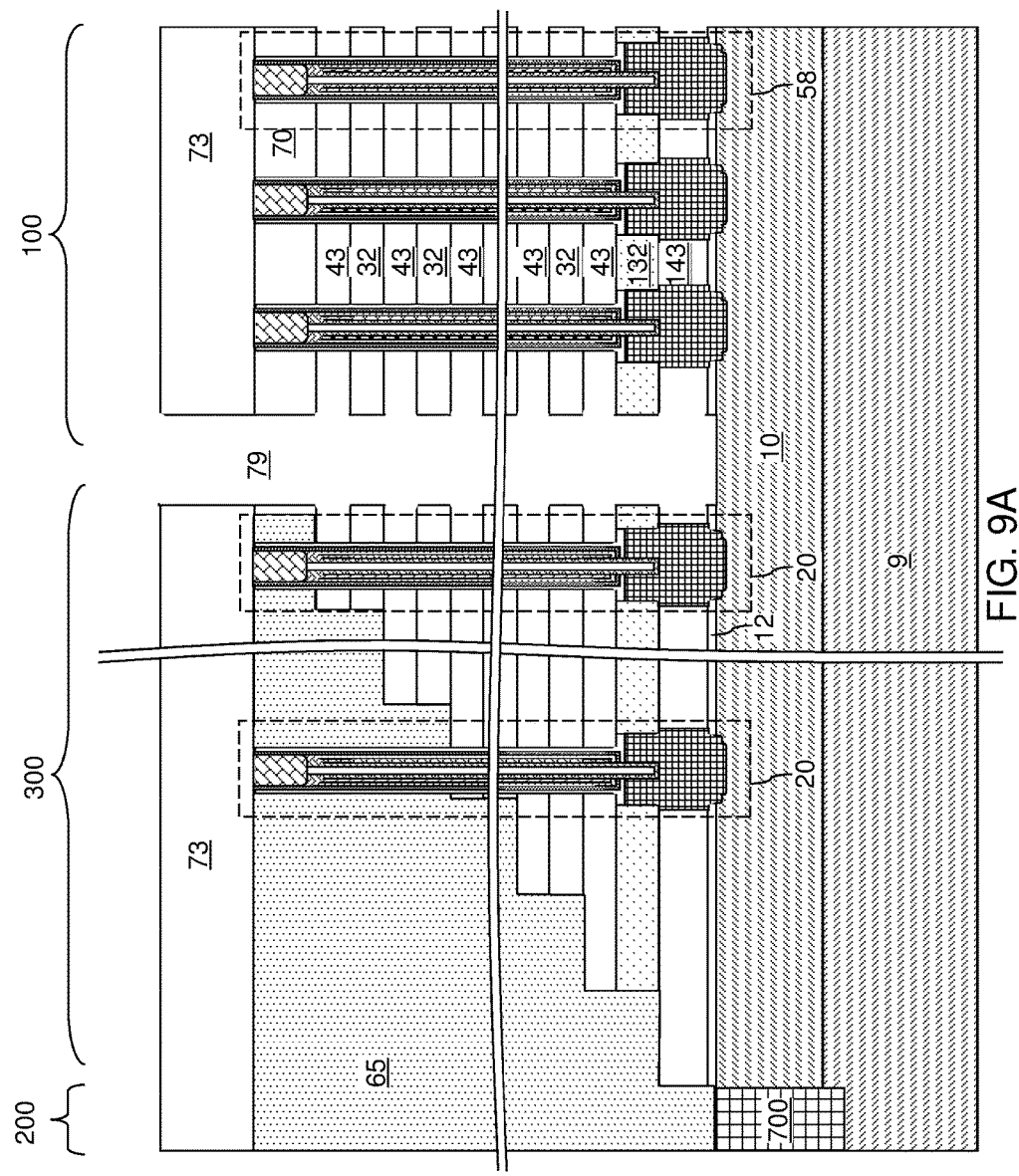
FIG. 9A is a schematic vertical cross-sectional view of the exemplary structure after formation of backside recesses according to an embodiment of the present disclosure.

Referring to FIGS. 9A and 9B, an etchant that selectively etches the materials of the word-line-level sacrificial material layers 42 and the bottommost sacrificial material layer 142 with respect to the material of the inter-word-line insulating layers 32, the bottommost insulating layer 132, and the material of the semiconductor material layer 10 can be introduced into the backside trenches 79, for example, employing an etch process. Backside recesses 43 are formed in volumes from which the word-line-level sacrificial material layers 42 and the bottommost sacrificial material layer 142 are removed. The removal of the material of the word-line-level sacrificial material layers 42 can be selective to the material of the inter-word-line insulating layers 32, the material of the bottommost insulating layer 132 the material of the retro-stepped dielectric material portion 65, the semiconductor material of the semiconductor material layer 10, and the material of the outermost layer of the memory films 50. In one embodiment, the bottommost sacrificial material layer 142 can include the first silicon nitride material described above, the word-line-level sacrificial material layers 42 can include the second silicon nitride material described above, the material of the bottommost insulating layer 132 can include the first silicon oxide material described above, the material of the inter-word-line insulating layers 32 can include the second silicon oxide material described above, and the material of the retro-stepped dielectric material portion 65 can include silicon oxide such as doped silicate glass or undoped silicate glass.

The etch process that removes the material selective to the material and the outermost layer of the memory films 50 can be a wet etch process employing a wet etch solution, or can be a gas phase (dry) etch process in which the etchant is introduced in a vapor phase into the backside trenches 79. For example, the bottommost sacrificial material layer 142 includes the first silicon nitride material described above and if the word-line-level sacrificial material layers 42 includes the second silicon nitride material described above, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the word-line-level sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the materials of the bottommost sacrificial material layer 142 and the word-line-level sacrificial material layers 42 are removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying inter-word-line insulating layer 32 and a bottom surface of an overlying inter-word-line insulating layer 32. In one embodiment, each backside recess 43 can have a uniform height throughout.

Figure 10A:
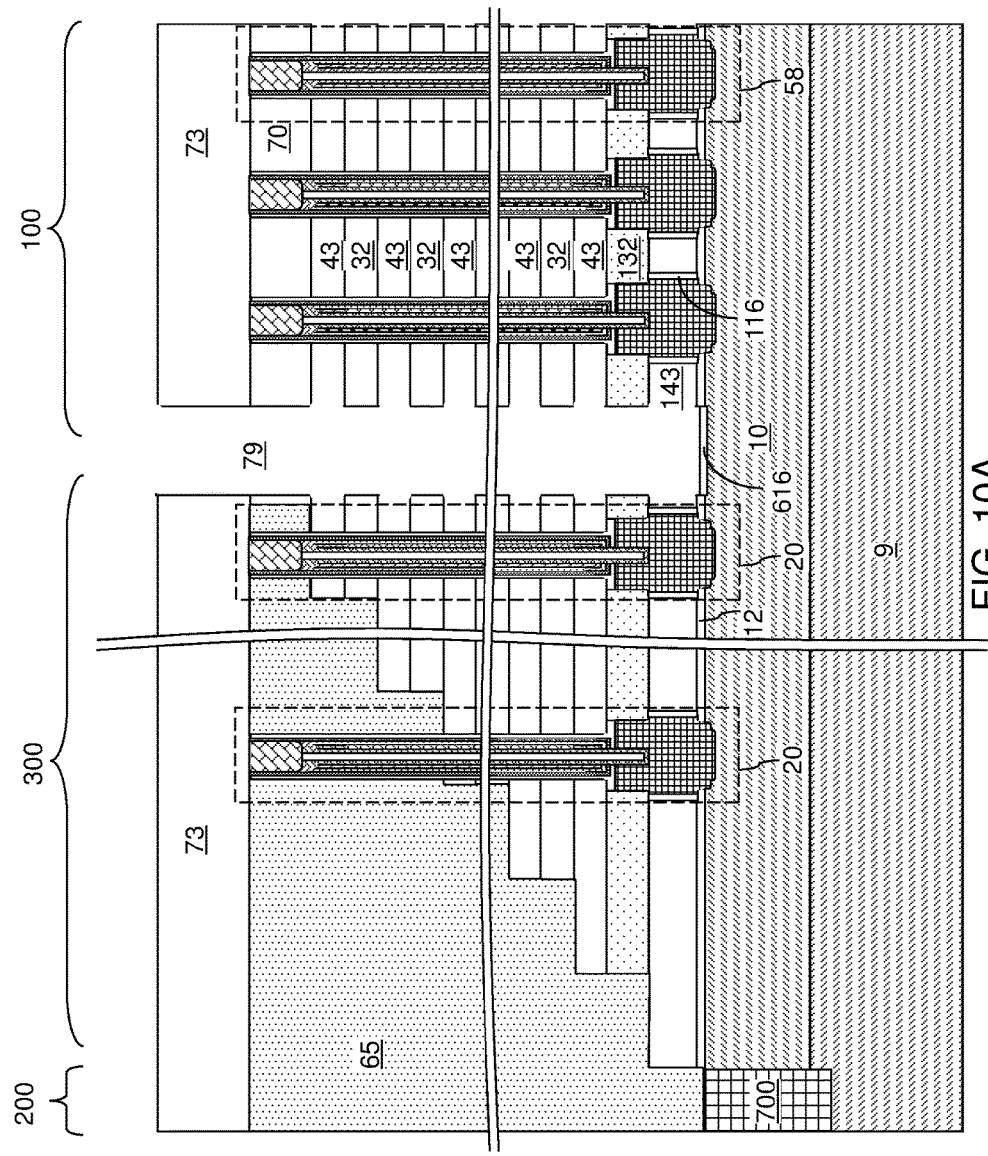
FIG. 10A is a schematic vertical cross-sectional view of the exemplary structure after formation of backside recesses and tubular dielectric spacers according to an embodiment of the present disclosure.
Figure 10B:
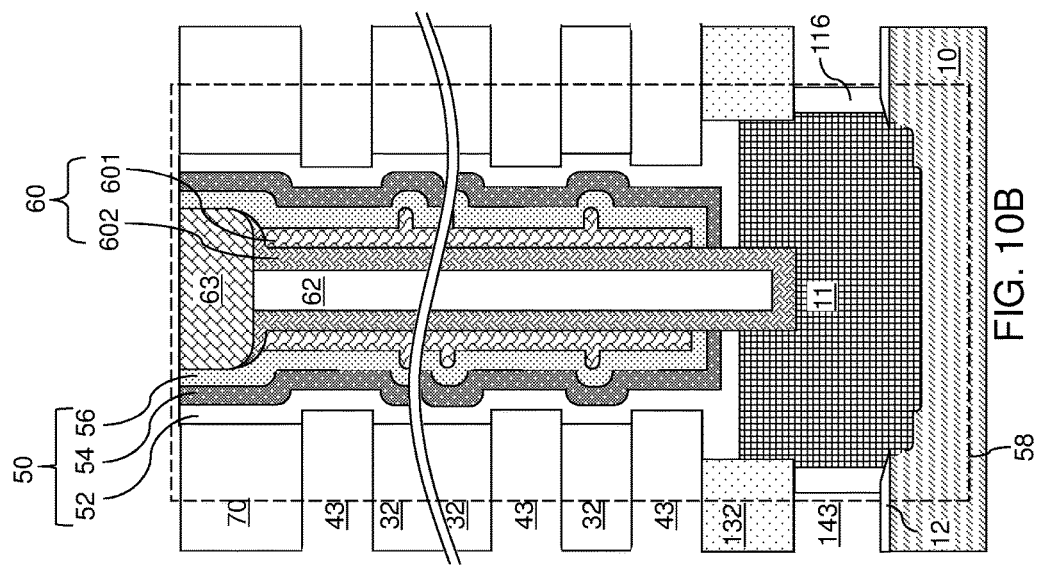
FIG. 10B is a magnified view of a region of the exemplary structure of FIG. 10A around a memory opening fill structure.

Referring to FIGS. 10A and 10B, an oxidation process can be performed to convert physically exposed portions of semiconductor materials into semiconductor oxide portions. For example, an annular silicon oxide spacer 116 can be formed around each pedestal channel portion 11 by oxidizing a surface portion of each pedestal channel portion 11 after formation of the backside recesses 43. A surface semiconductor oxide portion 616 can be formed at the bottom of each backside trench by oxidation of a surface portion of the semiconductor material layer 10 underneath the backside trenches 79. The oxidation process can be a thermal oxidation process or a plasma oxidation process. The lateral thickness of each annular silicon oxide spacer 116, as measured between an outer sidewall and an inner sidewall, can be in a range from 1 nm to 10 nm, such as from 2 nm to 6 nm, although lesser and greater thicknesses can also be employed.

Figure 11A:
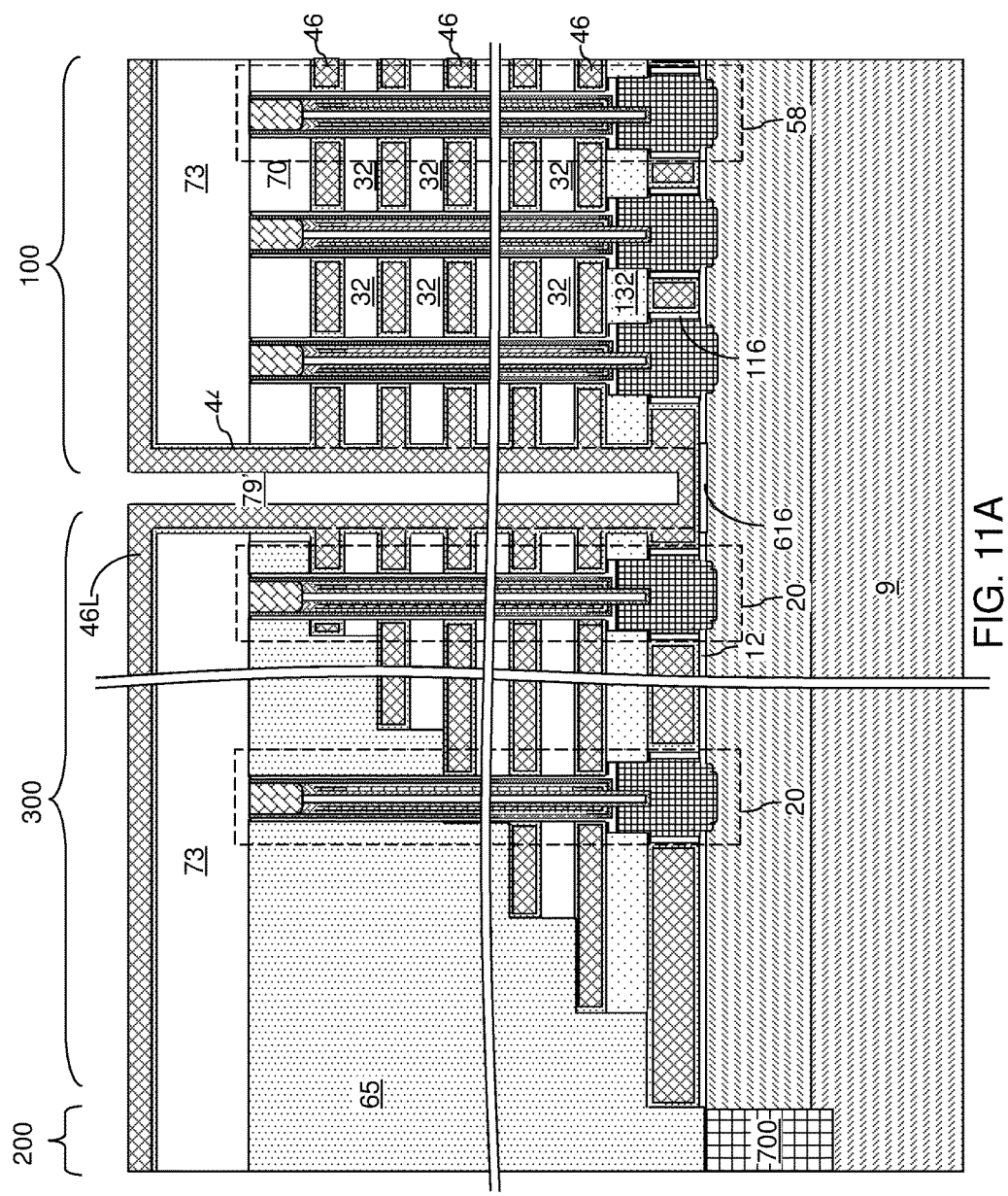
FIG. 11A is a vertical cross-sectional view of the exemplary structure after formation of electrically conductive layers by deposition of a conductive material according to an embodiment of the present disclosure.
Figure 11B:
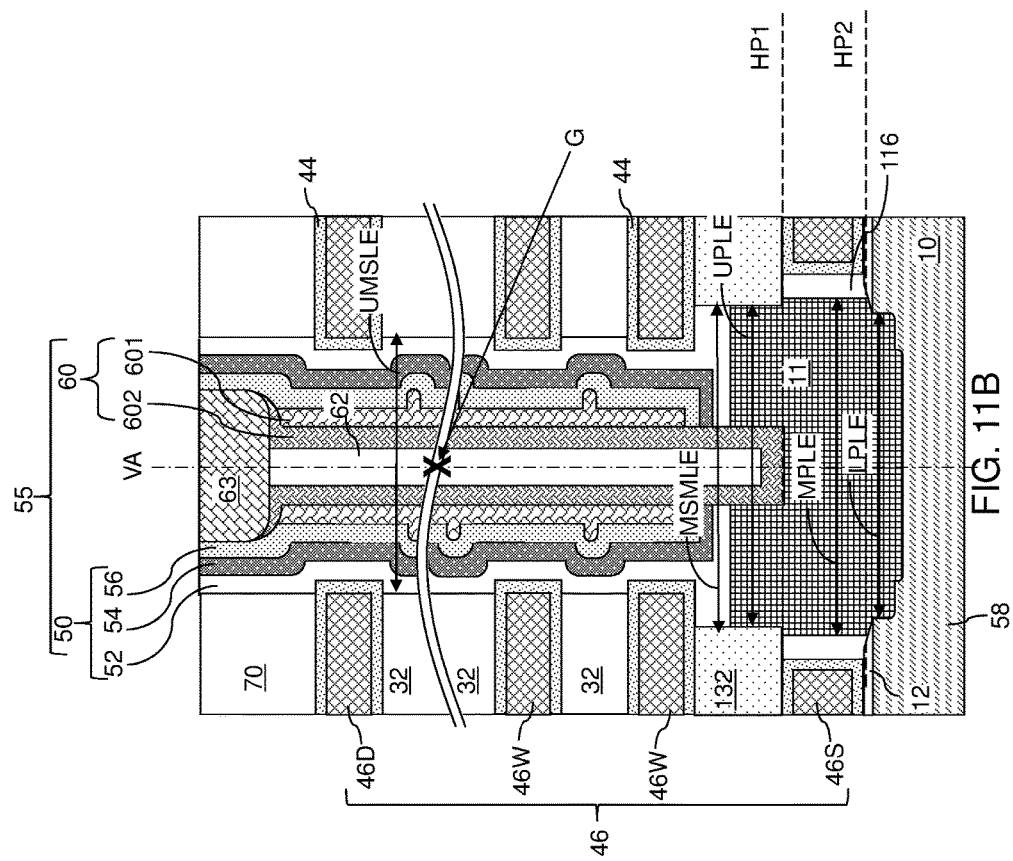
FIG. 11B is a magnified view of a region of the exemplary structure of FIG. 11A around a memory opening fill structure.

Referring to FIGS. 11A and 11B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the inter-word-line insulating layers 32 and sidewalls of the memory stack structures 55 within the backside recesses 43 and sidewalls of the annular silicon oxide spacers 116. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the inter-word-line insulating layers 32, the portions of the sidewall surfaces of the memory stack structures 55 that are physically exposed to the backside recesses 43, and the outer sidewalls of the annular silicon oxide spacers 116. A backside cavity 79' is present within the portion of each backside trench 79 that is not filled with the backside blocking dielectric layer 44.

At least one conductive material is deposited in the backside recesses 43 by a respective conformal deposition process. For example, the at least one conductive material can include a metallic barrier layer and a metallic fill material. In this case, the metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the inter-word-line insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43. A continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers, which can be a pair of inter-word-line insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79 or above the contact level dielectric layer 73.

Each word-line-level sacrificial material layer 42 can be replaced with an electrically conductive layer 46. As shown in FIG. 11B, in one embodiment, the electrically conductive layers 46 comprise word lines 46W, source select gate electrode 46S and drain select gate electrode 46D of a NAND memory device. The bottommost sacrificial material layer 142 can be replaced with a bottommost electrically conductive layer 46S (e.g., the source select gate electrode) of the electrically conductive layers 46. A backside cavity 79' is present in the portion of each backside trench 79 that is not filled with the backside blocking dielectric layer 44 and the continuous metallic material layer 46L. An annular silicon oxide spacer 116 laterally surrounds a pedestal channel portion 11. The bottommost electrically conductive layer 46S laterally surrounds each annular silicon oxide spacer 116 (e.g., the gate dielectric of the source select transistor) upon formation of the electrically conductive layers 46. The bottommost electrically conductive layer 46S functions as a source select gate electrode of a source select transistor of a vertical NAND string, as will be described in more detail below.

A pedestal channel portion 11 is located at a bottom portion of each memory opening 49. The pedestal channel portion 11 includes a semiconductor material, and contacts a top surface of the semiconductor material layer 10 in the substrate (9, 10). As shown in FIG. 11B, the pedestal channel portion 11 has an upper pedestal lateral extent UPLE, which is a maximum lateral extent of an entire portion of the pedestal channel portion 11 above the first horizontal plane HP1 including the bottom surface of the bottommost insulating layer 132 among the insulating layers (132, 32). The pedestal channel portion 11 can have a middle pedestal lateral extent MPLE, which is a maximum lateral extent of the pedestal channel portion 11 between the first horizontal plane HP1 and a second horizontal plane HP2 including a top surface of the gate dielectric layer 12. The middle pedestal lateral extent MPLE is greater than upper memory stack structure lateral extent UMSLE, which is the maximum lateral extent of an entire portion of the memory stack structure 55 that is located above a horizontal plane including the top surface of the bottommost insulating layer 132.

In one embodiment, the pedestal channel portion 11 has a lower pedestal lateral extent LPLE, which is a maximum lateral extent of the pedestal channel portion 11 below the second horizontal plane HP2, and the lower pedestal lateral extent is greater than the upper memory stack structure lateral extent UMSLE. A dielectric layer such as the gate dielectric layer 12 can be located between the substrate and a bottommost electrically conductive layer 46S (e.g., the source select gate electrode) among the electrically conductive layers 46 (which include word lines and source and drain select gate electrodes). The dielectric layer includes an opening around each memory opening at which a tapered annular sidewall of the dielectric layer contacts a tapered annular surface of the pedestal channel portion 11.

A memory stack structure 55 is located within each memory opening 49. The memory opening 49 may have a straight sidewall, or a sidewall that has a laterally-undulating vertical cross-sectional profile, through the inter-word-line insulating layers 32 and electrically conductive layers 46 overlying the bottommost insulating layer 132. In one embodiment, each electrically conductive layer 46 (e.g., word lines and drain select gate electrode(s)) other than a bottommost electrically conductive layer 46S (e.g., the source select gate electrode) in the alternating stack (132, 32, 46) can be more proximal to a vertical axis VA passing through a geometrical center G of the memory stack structure 55 than each insulating layer 32 other than the bottommost insulating layer 132 in the alternating stack (132, 32, 46) is to the vertical axis VA. The bottommost insulating layer 132 can be more distal from the vertical axis VA than each inter-word-line insulating layers 32 and each electrically conductive layer 46 other than the bottommost electrically conductive layer 46S is from the vertical axis VA.

Figure 12:
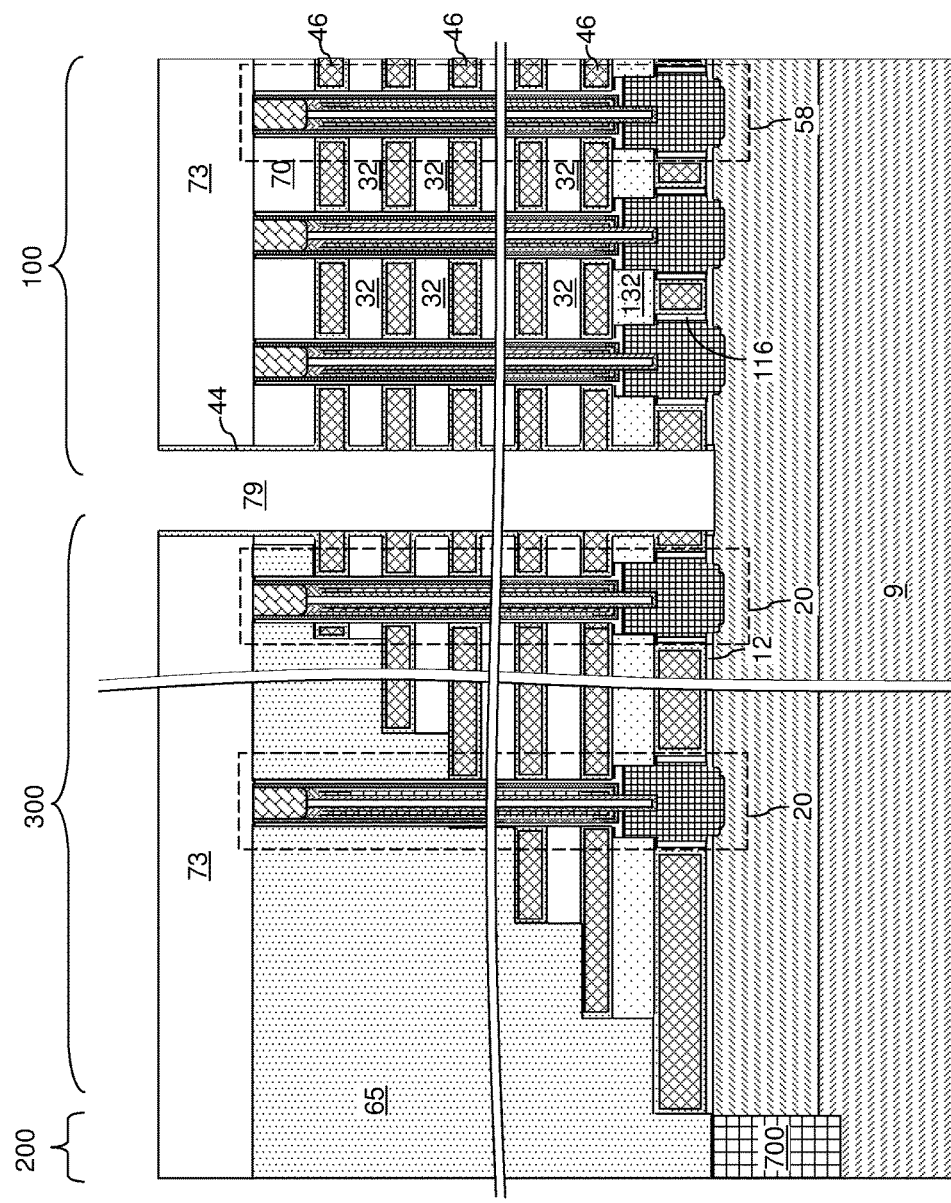
FIG. 12 is a schematic vertical cross-sectional view of the exemplary structure after removal of a deposited conductive material from within the backside trench according to an embodiment of the present disclosure.

Referring to FIG. 12, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the word-line-level sacrificial material layers 42 are replaced with the electrically conductive layers 46.

Each electrically conductive layer 46 other than the bottommost electrically conductive layer 46S can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. A backside cavity 79' is present within each backside trench 79.

Figure 13:
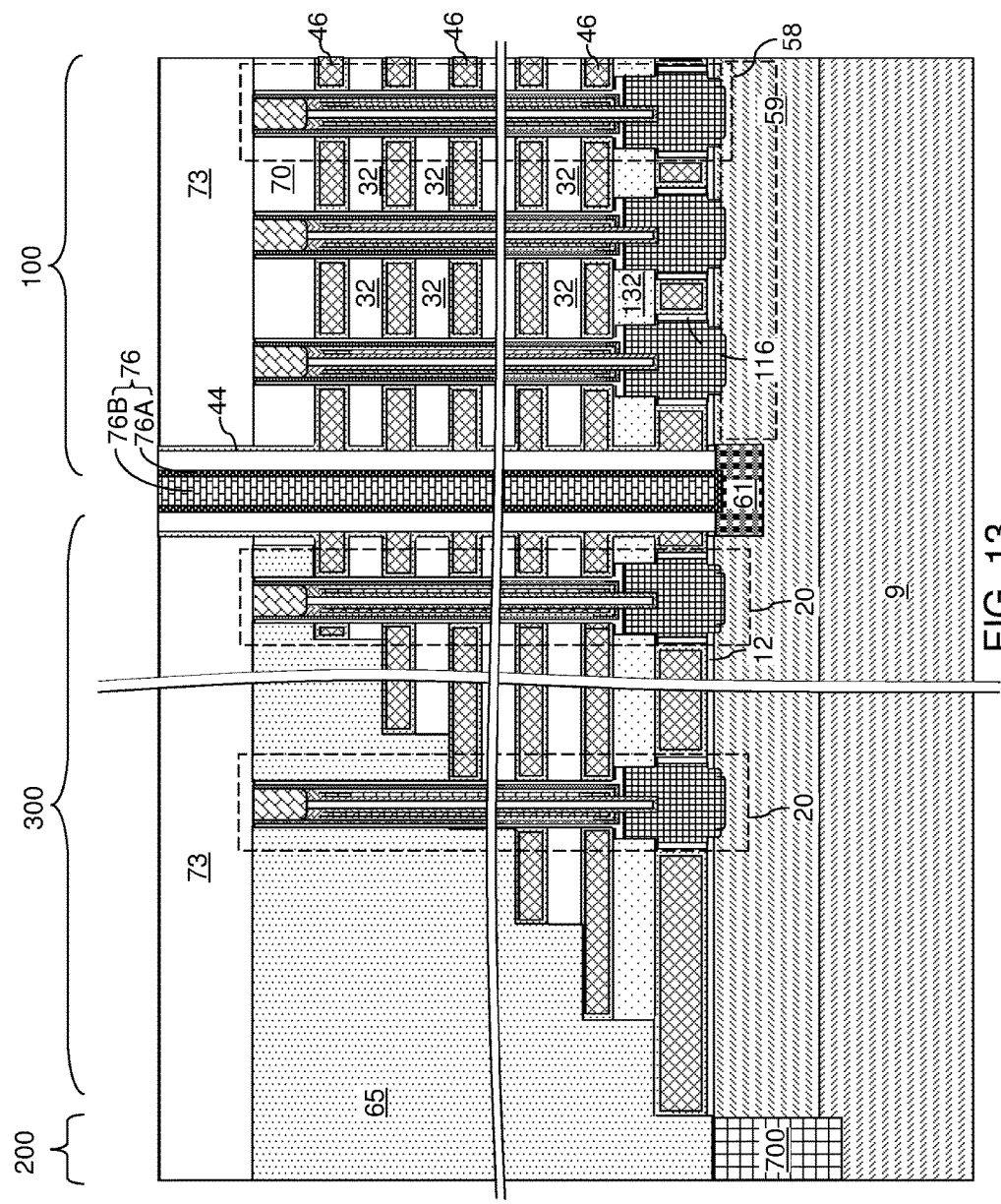
FIG. 13 is a schematic vertical cross-sectional view of the exemplary structure after formation of insulating spacers and backside contact structures according to an embodiment of the present disclosure.

Referring to FIG. 13, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the inter-word-line insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 at the bottom of each backside cavity 79'. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

A bottommost electrically conductive layer 46S provided upon formation of the electrically conductive layers 46 within the alternating stack (132, 32, 46) can comprise a source side select gate electrode for the source side select transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (132, 32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (132, 32, 46), and contacts a top surface of the source region 61. If a backside blocking dielectric layer 44 is employed, the backside contact via structure 76 can contact a sidewall of the backside blocking dielectric layer 44.

Figure 14A:
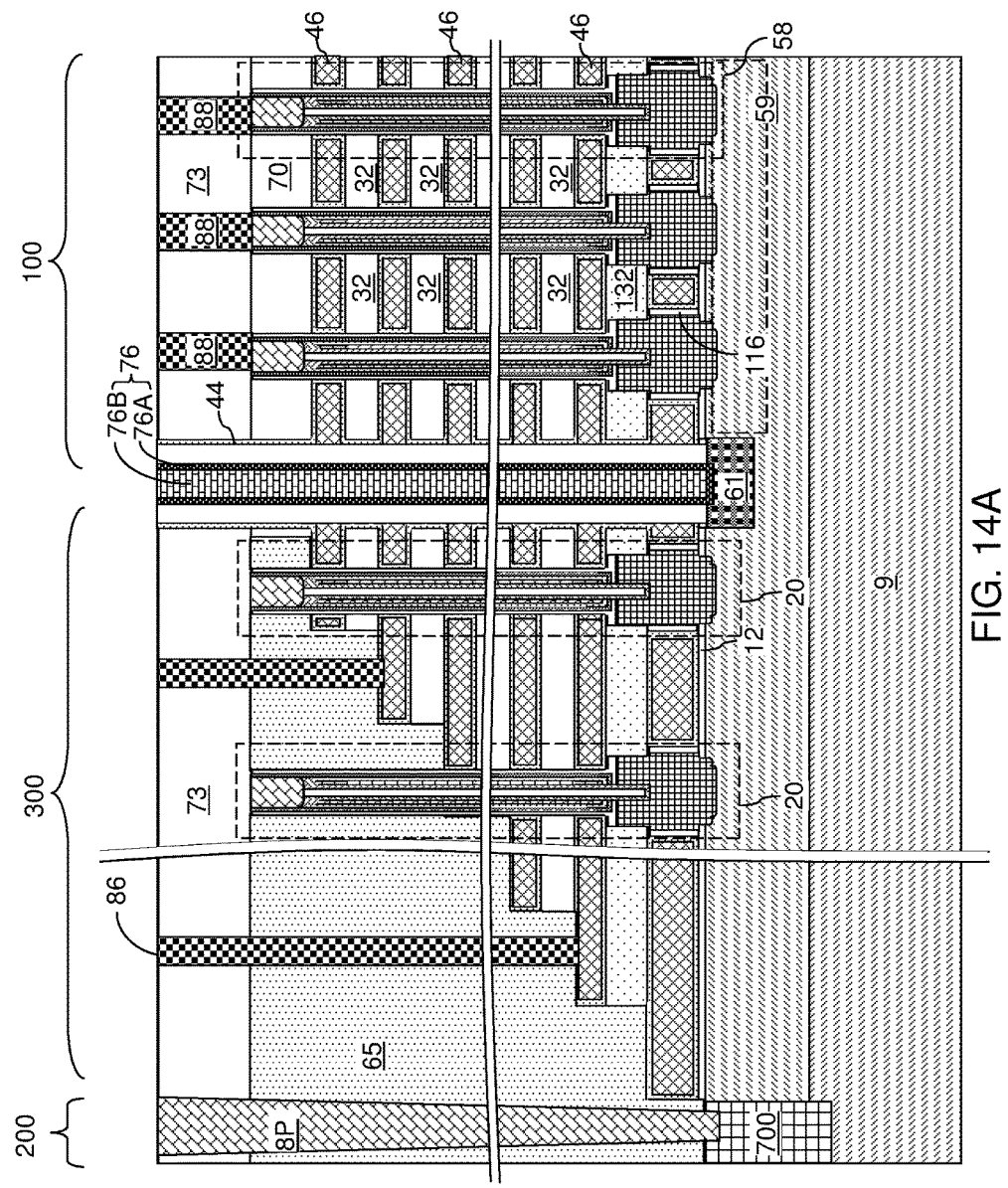
FIG. 14A is a schematic vertical cross-sectional view of the exemplary structure after formation of additional contact via structures according to an embodiment of the present disclosure.
Figure 14B:
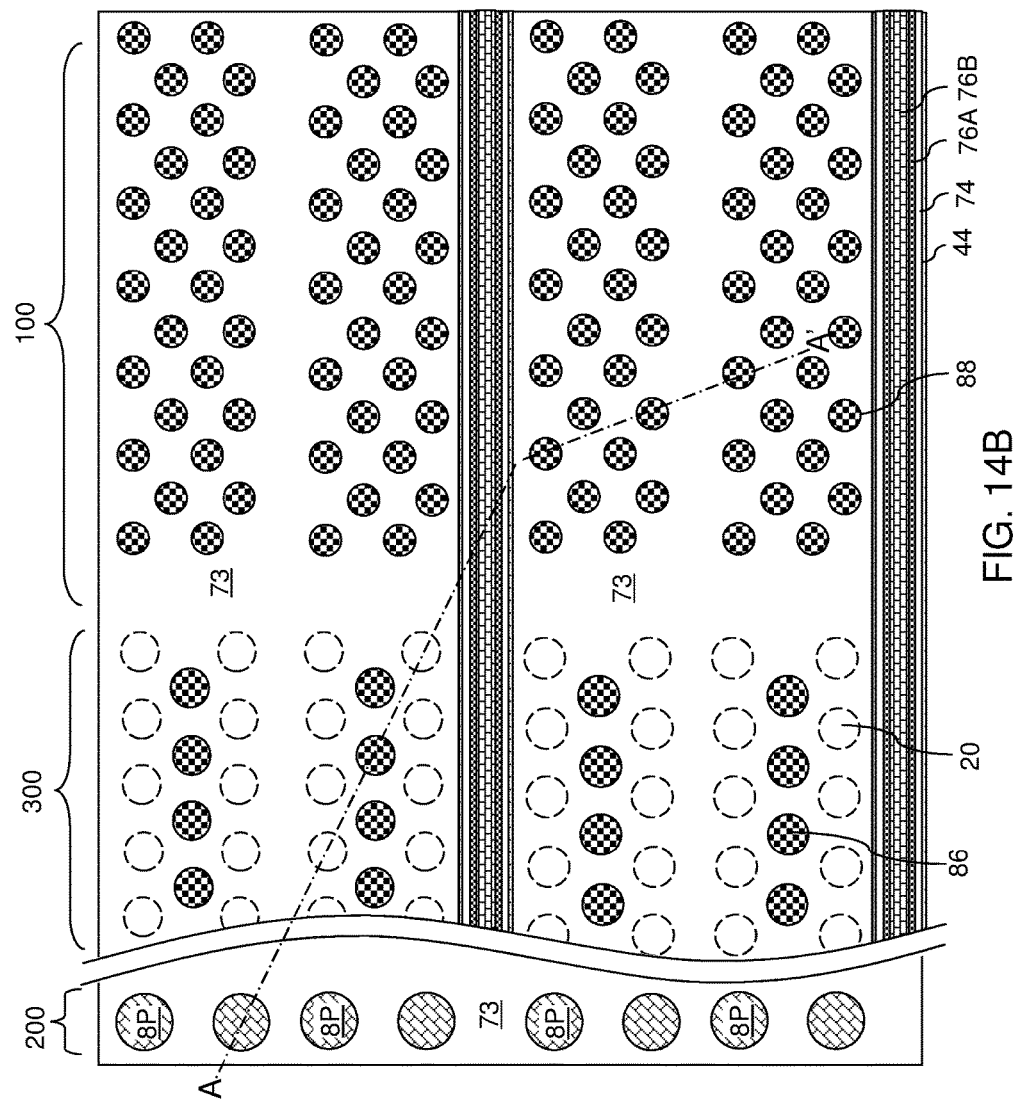
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings of the present disclosure, the present disclosure provides a three-dimensional memory device. The three-dimensional memory device includes an alternating stack of insulating layers (132, 32) and electrically conductive layers 46 located over a substrate (9, 10), a memory opening 49 extending through the alternating stack (132, 32, 46); a semiconductor pedestal channel portion 11 located at a bottom portion of the memory opening 49, and a memory stack structure 55 located in the memory opening 49 and contacting a top surface of the pedestal channel portion 11. The memory stack structure 55 comprises a memory film 50 and a vertical semiconductor channel 60 located inside the memory film 50. A bottommost insulating layer 132 among the insulating layers (32, 132) comprises a first silicon oxide material, and at least some of the insulating layers 32 other than the bottommost insulating layer 132 comprise a second silicon oxide material having a greater density than the first silicon oxide material.

In one embodiment, the bottommost insulating layer 132 is less proximal to a vertical axis VA passing through a geometrical center G of the memory stack structure 55 than each other insulating layer 32 among the insulating layers (32, 132).

In one embodiment, the pedestal channel portion contacts 11 a top surface of the substrate (9, 10). In one embodiment, the second silicon oxide material has a lesser etch rate in a buffered hydrofluoric acid solution containing a 6:1 volume ratio of 40% NH$_4$F in water to 49% HF in water than the first silicon oxide material.

In one embodiment shown in FIG. 11B, the pedestal channel portion 11 has an upper pedestal lateral extent UPLE, which is a maximum lateral extent of an entire portion of the pedestal channel portion 11 located above a first horizontal plane HP1 including a bottom surface of a bottommost insulating layer 132 among the insulating layers (132, 32). An upper memory stack structure lateral extent UMSLE, which is a maximum lateral extent of an entire portion of the memory stack structure 55 located above a horizontal plane including a top surface of the bottommost insulating layer 132, is less than the upper pedestal lateral extent UPLE.

In one embodiment shown in FIG. 11B, the memory stack structure 55 has a memory stack structure maximum lateral extent MSMLE, which is a maximum lateral extent of an entirety of the memory stack structure 55, at a level of the bottommost insulating layer 132. In one embodiment, the memory stack structure maximum lateral extent MSMLE is the same as the upper pedestal channel extent UPLE.

In one embodiment shown in FIG. 11B, a bottommost electrically conductive layer 46S among the electrically conductive layers 46 is located underneath the bottommost insulating layer 132. The bottommost electrically conductive layer 46S can be more distal from the vertical axis VA passing through the geometrical center of the memory stack structure 55 than sidewalls of the bottommost insulating layer 132, the inter-word-line insulating layers 32 (i.e., all insulating layers 132 other than the bottommost insulating layer 132), and all other electrically conductive layers 46W, 46D.

In one embodiment, the three-dimensional memory device can comprise an annular silicon oxide spacer 116 laterally surrounding the pedestal channel portion 11 and located between the pedestal channel portion 11 and the bottommost electrically conductive layer 46S among the electrically conductive layers 46. The bottommost electrically conductive layer 46S can be more distal from the vertical axis VA than the bottommost insulating layer 132.

In one embodiment shown in FIG. 11B, the electrically conductive layers 46 comprise word lines 46W, source select gate electrode 46S and drain select gate electrode 46D of a NAND memory device. The bottommost electrically conductive layer 46S comprises the source select gate electrode, and the source select gate electrode is more distal from the vertical axis VA than the word lines 46W. The annular silicon oxide spacer 116 comprises a gate dielectric of a source select transistor of the NAND memory device.

In one embodiment, the memory opening 49 has a sidewall that has a laterally-undulating vertical cross-sectional profile. Each electrically conductive layer (46D, 46W) other than the bottommost electrically conductive layer 46S in the alternating stack is more proximal to the vertical axis VA than each insulating layer 32 other than the bottommost insulating layer 132 in the alternating stack. The bottommost insulating layer 132 is more distal from the vertical axis VA than each electrically conductive layer (46D, 46W) other than the bottommost electrically conductive layer 46S. The bottommost electrically conductive layer 46S is more distal from the vertical axis VA than the bottommost insulating layer 132.

In one embodiment, the three-dimensional memory device comprises a monolithic three-dimensional NAND memory device, and the electrically conductive layers 46 comprise, or are electrically connected to, a respective word line of the monolithic three-dimensional NAND memory device. The substrate can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device (such as the at least one semiconductor device illustrated in FIG. 1) located thereon. The electrically conductive layers 46 comprise a plurality of control gate electrodes having a strip shape extending substantially parallel to the top surface of the substrate (for example, between a pair of backside trenches 79), and the plurality of control gate electrodes can comprise at least a first control gate electrode located in the first device level and a second control gate electrode located in the second device level. The array of monolithic three-dimensional NAND strings can comprise: a plurality of semiconductor channels (59, 11, 60), wherein at least one end portion of each of the plurality of semiconductor channels (59, 11, 60) extends substantially perpendicular to a top surface of the substrate, and a plurality of charge storage elements (as embodied as portions of the charge storage layer 54 located at levels of the electrically conductive layers 46), each charge storage element located adjacent to a respective one of the plurality of semiconductor channels (59, 11, 60).

The present disclosure provides a structurally reinforced, stress-resistant pedestal channel portion 11, which has a greater lateral dimension than the maximum lateral dimension of memory openings formed at the processing steps of FIG. 6A. The greater lateral dimension of each pedestal channel portion 11 provides a mechanically stronger support structure during the processing steps of FIGS. 9A, 9B, 10A, and 10B in which backside recesses 43 are present. The structurally reinforced pedestal channel portions 11 of the embodiments of the present disclosure prevent or reduce breakage or cracking of the pedestal channel portions 11 during formation of the electrically conductive layers 46. Further, the increased physically exposed surface area of the semiconductor material layer 10 for growing the pedestal channel portions 11, as provided at the processing steps of FIG. 6D, facilitates growth of high quality semiconductor material (which may be an epitaxial semiconductor material such as epitaxial silicon) for the pedestal channel portions 11 at the processing steps of FIG. 6E. Yet further, the tapered annular sidewalls of the gate dielectric layer 12 can minimize introduction of growth defects during the selective deposition process that forms the pedestal channel portions 11. The combination of the above effects can provide high quality pedestal channel portions 11 with reduced defect density and enhanced mechanical strength for preventing structural damage during formation of the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
a memory opening extending through the alternating stack;
a semiconductor pedestal channel portion located at a bottom portion of the memory opening; and
a memory stack structure located in the memory opening and contacting a top surface of the pedestal channel portion, wherein the memory stack structure comprises a memory film and a vertical semiconductor channel located inside the memory film,
wherein a bottommost insulating layer among the insulating layers comprises a first silicon oxide material, and at least some of the insulating layers other than the bottommost insulating layer comprise a second silicon oxide material having a greater density than the first silicon oxide material; and
wherein the bottommost insulating layer is less proximal to a vertical axis passing through a geometrical center of the memory stack structure than each other insulating layer among the insulating layers.

2. A three-dimensional memory device comprising:
an alternating stack of insulating layers and electrically conductive layers located over a substrate;
a memory opening extending through the alternating stack;
a semiconductor pedestal channel portion located at a bottom portion of the memory opening; and
a memory stack structure located in the memory opening and contacting a top surface of the pedestal channel portion, wherein the memory stack structure comprises a memory film and a vertical semiconductor channel located inside the memory film,
wherein:
a bottommost insulating layer among the insulating layers comprises a first silicon oxide material, and at least some of the insulating layers other than the bottommost insulating layer comprise a second silicon oxide material having a greater density than the first silicon oxide material;
the pedestal channel portion has an upper pedestal lateral extent, which is a maximum lateral extent of an entire portion of the pedestal channel portion located above a first horizontal plane including a bottom surface of the bottommost insulating layer among the insulating layers; and
an upper memory stack structure lateral extent, which is a maximum lateral extent of an entire portion of the memory stack structure located above a horizontal plane including a top surface of the bottommost insulating layer, is less than the upper pedestal lateral extent.

3. The three-dimensional memory device of claim 2, wherein:
the memory stack structure has a memory stack structure maximum lateral extent, which is a maximum lateral extent of an entirety of the memory stack structure, at a level of the bottommost insulating layer; and
the memory stack structure maximum lateral extent is the same as the upper pedestal channel extent.

4. The three-dimensional memory device of claim 2, wherein a bottommost electrically conductive layer among the electrically conductive layers is located underneath the bottommost insulating layer.

5. The three-dimensional memory device of claim 4, wherein:
the pedestal channel portion has a middle pedestal lateral extent, which is a maximum lateral extent of the pedestal channel portion between the first horizontal plane and a second horizontal plane including a top surface of a dielectric layer located between the substrate and the bottommost electrically conductive layer; and
the middle pedestal lateral extent is greater than upper memory stack structure lateral extent.

6. The three-dimensional memory device of claim 5, wherein:
the pedestal channel portion has a lower pedestal lateral extent, which is a maximum lateral extent of the pedestal channel portion below the second horizontal plane; and
the lower pedestal lateral extent is greater than the upper memory stack structure lateral extent.

7. A three-dimensional memory device comprising:
an alternating stack of insulating layers and electrically conductive layers located over a substrate;
a memory opening extending through the alternating stack;
a semiconductor pedestal channel portion located at a bottom portion of the memory opening;
a memory stack structure located in the memory opening and contacting a top surface of the pedestal channel portion, wherein the memory stack structure comprises a memory film and a vertical semiconductor channel located inside the memory film; and
an annular silicon oxide spacer laterally surrounding the pedestal channel portion and located between the pedestal channel portion and a bottommost electrically conductive layer among the electrically conductive layers;
wherein:
a bottommost insulating layer among the insulating layers comprises a first silicon oxide material, and at least some of the insulating layers other than the bottommost insulating layer comprise a second silicon oxide material having a greater density than the first silicon oxide material;
the electrically conductive layers comprise word lines, source select gate electrode and drain select gate electrode of a NAND memory device;
the bottommost electrically conductive layer comprises the source select gate electrode;
the source select gate electrode is more distal from the vertical axis than the word lines; and
the annular silicon oxide spacer comprises a gate dielectric of a source select transistor of the NAND memory device.

8. A three-dimensional memory device comprising:
an alternating stack of insulating layers and electrically conductive layers located over a substrate;
a memory opening extending through the alternating stack;
a semiconductor pedestal channel portion located at a bottom portion of the memory opening; and
a memory stack structure located in the memory opening and contacting a top surface of the pedestal channel portion, wherein the memory stack structure comprises a memory film and a vertical semiconductor channel located inside the memory film,
wherein:
a bottommost insulating layer among the insulating layers comprises a first silicon oxide material, and at least some of the insulating layers other than the bottommost insulating layer comprise a second silicon oxide material having a greater density than the first silicon oxide material;
the memory opening has a sidewall that has a laterally-undulating vertical cross-sectional profile;
each electrically conductive layer other than a bottommost electrically conductive layer in the alternating stack is more proximal to the vertical axis than each insulating layer other than the bottommost insulating layer in the alternating stack;
the bottommost insulating layer is more distal from the vertical axis than each electrically conductive layer other than the bottommost electrically conductive layer; and
the bottommost electrically conductive layer is more distal from the vertical axis than the bottommost insulating layer.

9. A method of forming a three-dimensional memory device, comprising:
forming an alternating stack of insulating layers and sacrificial material layers over a substrate, wherein a bottommost sacrificial material layer comprises a first sacrificial material, at least some of remaining sacrificial material layers other than the bottommost sacrificial material layer comprise a second sacrificial material that is different from the first sacrificial material, a bottommost insulating layer comprises a first insulating material, and at least some of remaining insulating layers other than the bottommost insulating layer comprise a second insulating material that is different from the first insulating material;
forming a memory opening through the alternating stack;
laterally recessing the bottommost insulating layer and the bottommost sacrificial material layer selective to the remaining sacrificial material layers and the remaining insulating layers around the memory opening;
forming a pedestal channel portion at a bottom portion of the memory opening at a level of the bottommost sacrificial material layer by a selective semiconductor deposition process;
forming a memory stack structure in a remaining volume of the memory opening and directly on the pedestal channel portion, wherein the memory stack structure comprises a memory film and a vertical semiconductor channel; and
replacing the sacrificial material layers with electrically conductive layers.

10. The method of claim 9, wherein:
the first insulating material comprises a first silicon oxide material;
the second insulating material comprises a second silicon oxide material having a greater density than the first silicon oxide material;
the first sacrificial material comprises a first silicon nitride material; and
the second sacrificial material comprises a second silicon nitride material having a greater density than the first silicon nitride material.

11. The method of claim 10, wherein:
the step of laterally recessing is performed by an isotropic hydrofluoric acid wet etch;
the bottommost insulating layer is laterally recessed further than the remaining insulating layers;
the bottommost sacrificial material layer is laterally recessed further than the remaining sacrificial material layers; and
the bottommost sacrificial material layer is laterally recessed further than the bottommost insulating layer.

12. The method of claim 10, wherein:
the first silicon oxide material has a lesser etch rate in the hydrofluoric acid than the first silicon nitride material; and
the first silicon nitride material has a greater etch rate in the hydrofluoric acid than the second silicon oxide material.

13. The method of claim 10, wherein:
the first silicon nitride material is deposited by a first plasma enhanced silicon nitride deposition process employing silane and nitrogen gas as process gases;
the second silicon nitride material is deposited by a second plasma enhanced silicon nitride deposition process employing silane and nitrogen gas as process gases; and
a ratio of a flow rate of nitrogen gas to a flow rate of silane in the first plasma enhanced silicon nitride deposition process is greater than in the second plasma enhanced silicon nitride deposition process.

14. The method of claim 13, wherein:
the first silicon oxide material is deposited by a first plasma enhanced silicon oxide deposition process employing silane and oxygen gas as process gases;
the second silicon oxide material is deposited by a second plasma enhanced silicon oxide deposition process employing silane and oxygen gas as process gases; and
a ratio of a flow rate of oxygen gas to a flow rate of silane in the first plasma enhanced silicon oxide deposition process is greater than in the second plasma enhanced silicon oxide deposition process.

15. The method of claim 9, further comprising:
forming a carbon-doped portion in an upper portion of the substrate prior to laterally recessing the bottommost insulating layer and the bottommost sacrificial material layer;
forming a semiconductor oxide plate by oxidizing a surface portion of the carbon-doped portion prior to laterally recessing the bottommost insulating layer and the bottommost sacrificial material layer; and
removing the semiconductor oxide plate and a remaining portion of the carbon-doped portion prior to formation of the pedestal channel portion.

16. The method of claim 15, further comprising:
forming a dielectric layer on the substrate, wherein the alternating stack is formed on the dielectric layer, and the memory opening extends through the dielectric layer;
forming a tapered annular surface around an opening through the dielectric layer while laterally recessing the bottommost insulating layer and the bottommost sacrificial material layer; and
removing the carbon-doped portion by an anisotropic etch after forming the tapered annular surface.

17. The method of claim 9, further comprising:
forming backside recesses by removing the sacrificial material layers after formation of the memory stack structure;
forming an annular silicon oxide spacer by oxidizing a surface portion of the pedestal channel portion after formation of the backside recesses; and
forming the electrically conductive layers in the backside recesses by depositing at least one conductive material in the backside recesses.

18. The method of claim 17, wherein:
a top surface of the pedestal channel portion contacts a sidewall of the bottommost insulating layer upon formation;
the pedestal channel portion has an upper pedestal lateral extent, which is a maximum lateral extent of an entire portion of the pedestal channel portion above a first horizontal plane including a bottom surface of the bottommost insulating layer; and
an upper memory stack structure lateral extent, which is a maximum lateral extent of an entire portion of the memory stack structure located above a horizontal plane including a top surface of the bottommost insulating layer, is less than the upper pedestal lateral extent.

19. The method of claim 17, wherein:
the electrically conductive layers comprise word lines, source select gate electrode and drain select gate electrode of a NAND memory device;
the bottommost electrically conductive layer comprises the source select gate electrode;
the source select gate electrode is more distal from the vertical axis than the word lines; and
the annular silicon oxide spacer comprises a gate dielectric of a source select transistor of the NAND memory device.

* * * * *